United States Patent
Ogihara et al.

(10) Patent No.: US 6,222,208 B1
(45) Date of Patent: Apr. 24, 2001

(54) LIGHT-EMITTING DIODE AND LIGHT-EMITTING DIODE ARRAY

(75) Inventors: Mitsuhiko Ogihara; Yukio Nakamura; Masumi Taninaka; Takatoku Shimizu, all of Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/089,093

(22) Filed: Jun. 2, 1998

(30) Foreign Application Priority Data

Jun. 6, 1997 (JP) .................................................. 9-149539
Nov. 28, 1997 (JP) .................................................. 9-328632
Feb. 24, 1998 (JP) ................................................. 10-041501

(51) Int. Cl.[7] ............................................................. H01L 33/00
(52) U.S. Cl. ........................... 257/101; 257/88; 257/96; 257/97; 257/91
(58) Field of Search ........................... 257/88, 96, 97, 257/101, 91, 99

(56) References Cited

U.S. PATENT DOCUMENTS

| | | |
|---|---|---|
| 4,037,241 | 7/1977 | Dierschke . |
| 4,623,907 * | 11/1986 | Okuda .................................. 257/97 |
| 4,942,439 | 7/1990 | Schairer . |
| 4,956,682 * | 9/1990 | Ohnaka .................................. 257/93 |
| 4,982,256 * | 1/1991 | Suzuki .................................. 257/190 |
| 5,075,744 * | 12/1991 | Tsui ...................................... 257/190 |
| 5,239,189 * | 8/1993 | Lawrence ............................... 257/99 |
| 5,272,362 * | 12/1993 | Yagi ...................................... 257/96 |
| 5,801,404 * | 9/1998 | Kahen .................................. 257/101 |

FOREIGN PATENT DOCUMENTS 55-63887 * 5/1980 (JP) .................................. 257/101
64-35970 2/1989 (JP) .

OTHER PUBLICATIONS

"Hakko–daiodo" (Light–emitting diodes) (Hetero–junction).
"Kotai Hakko–soshi to Sono Oyo" (Solid light–emitting elements and their uses)(4.2.1 Semiconductor pellet).

* cited by examiner

Primary Examiner—Jerome Jackson, Jr.
(74) Attorney, Agent, or Firm—Jones Volentine, LLC

(57) ABSTRACT

A light-emitting diode includes a first semiconductor epitaxial layer of a first conduction type, a second semiconductor epitaxial layer of the first conduction type laminated upon the first semiconductor epitaxial layer and having an energy band gap greater than that of the first semiconductor epitaxial layer, and an area of impurities formed within the first semiconductor epitaxial layer and the second semiconductor epitaxial layer by doping impurity of a second conduction type from the side of the second semiconductor epitaxial layer. A front of the diode is located within the first semiconductor epitaxial layer.

14 Claims, 18 Drawing Sheets

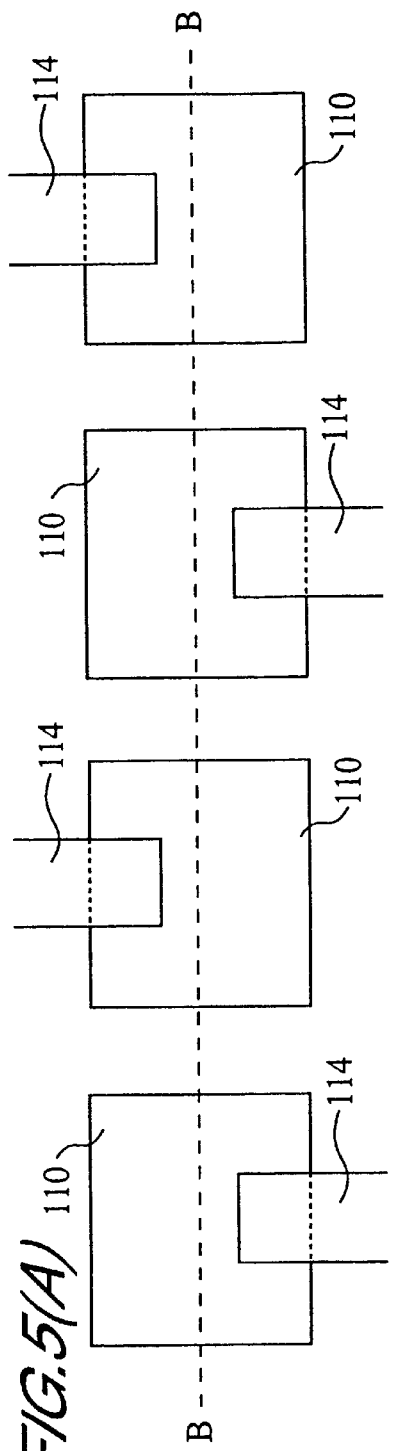
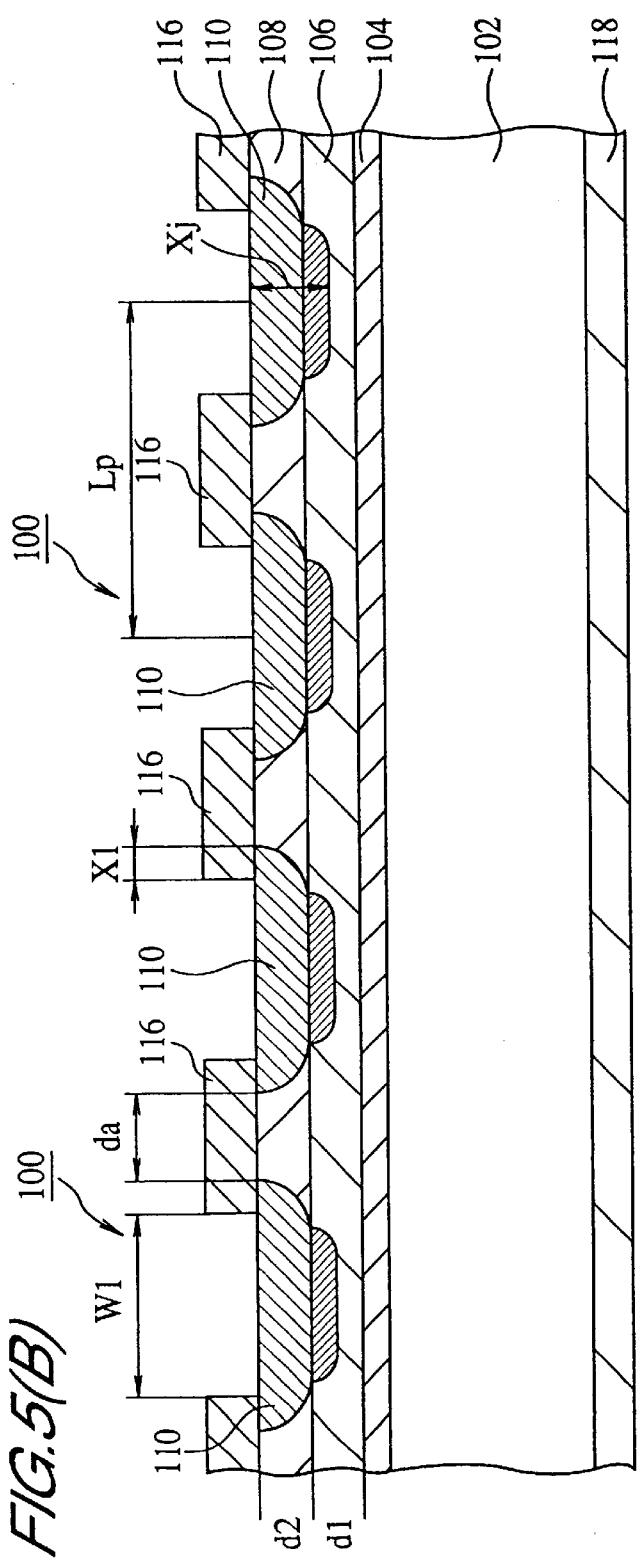
FIG.5(A)
FIG.5(B)

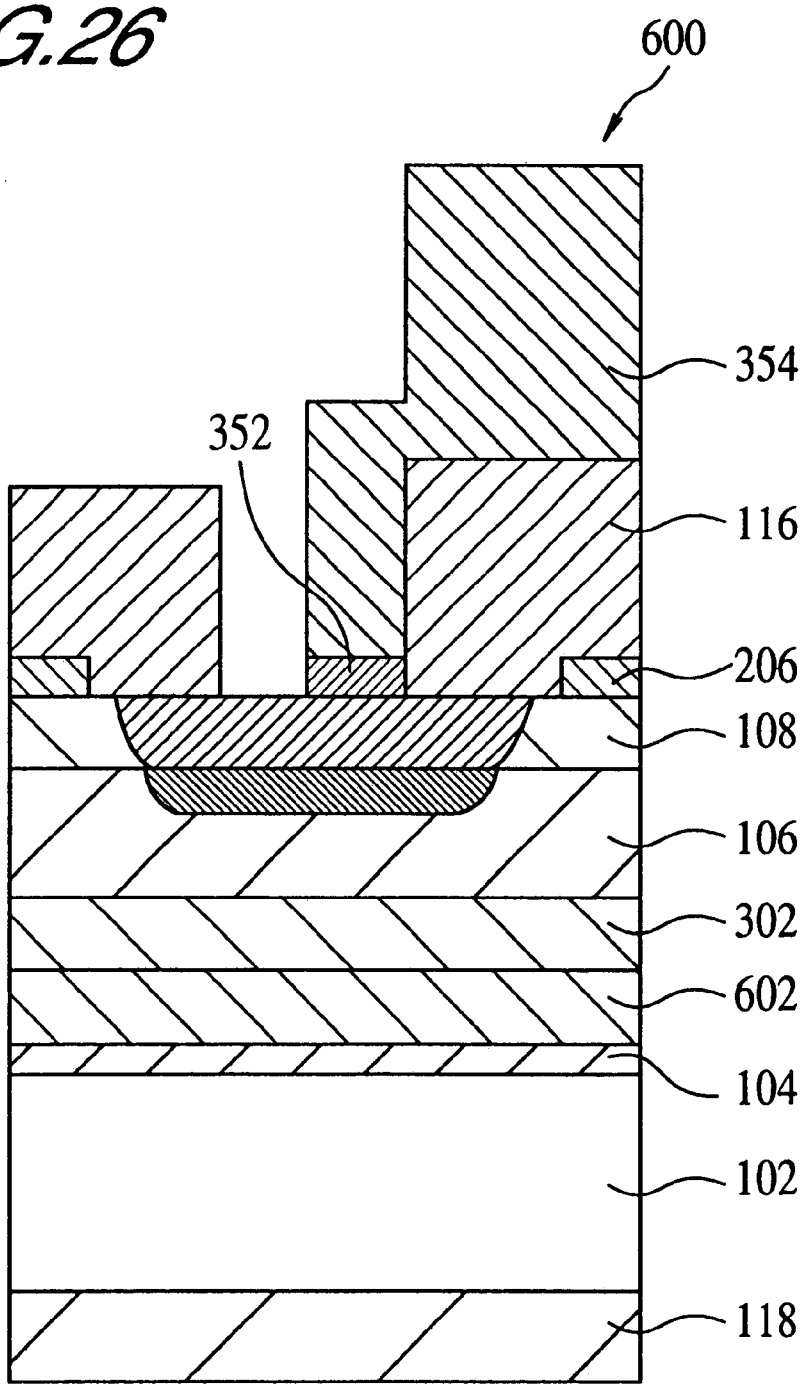

LIGHT-EMITTING DIODE AND LIGHT-EMITTING DIODE ARRAY

BACKGROUND OF THE INVENTION

1. Field of the Invention

The present invention relates to a light-emitting diode and a light-emitting diode array.

2. Description of the Related Art

Light-emitting diode (LED) have conventionally been widely used as display devices because of the brightness of the emitted light, their low driving voltage and the simplicity of the peripheral circuitry, among other reasons. As described for example in NAKAMURA Tetsurô and UCHIMARU Kiyoshi, Kotai Hakkô-soshi to sono Ôy ô [Solid light-emitting elements and their uses] (Sanpô, 1971), LEDs have hitherto been produced by diffusing impurities on a compound semiconductor substrate to form p-n junctions. FIG. 1 is a diagram illustrating a typical structure of a conventional LED.

In FIG. 1, the LED comprises an n-type GaAs substrate 11, an n-type GaAsP semiconductor first epitaxial layer 12 grown epitaxially on the n-type GaAs substrate 11 by doping with Te, a p-type GaAsP semiconductor first epitaxial layer 13 formed by diffusing Zn, a $SiO_2$ insulating film 14 which acts as a mask for Zn diffusion, an Al electrode 15 and an Au—Ge electrode 16, and is structured in such a manner as to form a p-n junction by diffusing the p-type impurity Zn on the n-type GaAsP substrate. A junction structured in this manner is generally referred to as a homojunction.

LEDs which are structured in this manner have the advantage of being easy to manufacture because relatively few processes are involved. On the other hand, they present a problem in that the wavelength of light produced when the small number of carriers injected through the junction rejoins the larger number of carriers is equal to the energy band gap of the substrate semiconductor. This means that much of the light generated is absorbed in the p-type area as it passes through, with the result that the light-emitting efficiency is not as high as it might be.

In contrast to such LEDs which depend on homojunction, there are others which utilise a p-n junction (hereinafter referred to as a heterojunction) formed by joining different crystals, as is described in OKUNO Tadao, Hakkô-daiôdo [Light-emitting diodes] (Sangyô Tosho, 1994). The adoption of a heterojunction allows the light-emitting efficiency of LEDs to be improved above that of homojunctions.

FIGS. 2 and 3 are diagrams illustrating examples of the structure of heterojunction LEDs and their energy band gaps. FIG. 2 provides an example of an LED of the type generally known as a single heterostructure (SH structure), while FIG. 3 is an example of the type generally known as a double heterostructure (DH structure).

The single heterostructure LED of FIG. 2 is formed by growing a p-type $Al_{0.35}Ga_{0.65}As$ layer epitaxially on a p-type GaAs substrate, and growing an n-type $Al_{0.35}Ga_{0.65}As$ layer epitaxially on top of that.

In a structure of this sort, as may be seen from FIG. 2(B), the holes which are injected through the junction are prevented from diffusing by the energy barrier on the surface of the heterojunction, with resulting increase in the rate of recombination. Moreover, the light-emission wavelength is equal to the energy band gap of the $Al_{0.35}Ga_{0.65}As$. Since the energy band gap of the n-type $Al_{0.65}Ga_{0.35}As$, which is the window for the extraction of light, is greater than that of the $Al_{0.35}Ga_{0.65}As$, the emitted light is not absorbed in the semiconductor area which acts as the window. Consequently the light-emitting efficiency increases.

Meanwhile, the double heterostructure LED of FIG. 3 is formed by sandwiching a p-type $Al_{0.35}Ga_{0.65}As$ active layer, the light-emitting area, between a p-type $Al_{0.65}Ga_{0.35}As$ clad layer with an energy band gap greater than that of the active layer on the one hand and an n-type $Al_{0.65}Ga_{0.35}As$ layer on the other. In a structure of this sort, as may be seen from FIG. 3 (B), the electrons and holes which are injected through the junction are prevented from diffusing by the energy barrier on the surface of the heterojunction, with resulting increase in the rate of recombination. Moreover, as with the single heterostructure LED, there is no absorption of light in the window area, and the light-emitting efficiency increases. LED arrays, in which the above LEDs are integrated, are used for instance as the light source in LED printers. Where LED arrays with homojunctions are produced, a p-n junction array can easily be manufactured by selective diffusion on to the semiconductor through the diffusion mask orifice. The manufacture of LED arrays by selective diffusion in this manner is a simple process, and it is possible to produce ultra-high-density LEDs of 1200 dpi.

However, if conventional LED arrays of this sort are to be produced with heterojunctions so as to make it possible to improve light-emitting efficiency, each LED needs to be separated by mesa etching for example, and the density of the LED array depends on how this process of separation is controlled. Restrictions on the extent to which the separation process can be controlled impose restrictions on the density of heterojunction LED arrays.

SUMMARY OF THE INVENTION

It is an object of the present invention to provide a light-emitting diode which can be arranged in high-density.

In accordance with one aspect of the present invention, the foregoing objects, among others, are achieved by providing a light-emitting diode comprising: a substrate; a first semiconductor epitaxial layer of a first conduction type formed on or above said substrate; a second semiconductor epitaxial layer of the first conduction type laminated upon the first conductor epitaxial layer and having an energy band gap greater than that of the first semiconductor epitaxial layer; and an area of impurities formed within the first semiconductor epitaxial layer and second semiconductor epitaxial layer by doping impurity of a second conduction type from the side of the second semiconductor epitaxial layer, its front being located within said first semiconductor epitaxial layer.

BRIEF DESCRIPTION OF THE DRAWINGS

FIG. 5(A) is a schematic plan view showing positional relationship between the electrode and the area of impurities in an LED array formed by the LED shown in FIG. 4, and FIG. 5(B) is a cross-sectional view illustrating the structure of the LED array taken along the line B—B in FIG. 5(A);

FIG. 26 is a cross-sectional view showing an LED of a sixth embodiment of the present application

DESCRIPTION OF THE PREFERRED EMBODIMENTS

The light-emitting element array and light-emitting element to which the present invention pertains may be applied to a single LED or to an LED array.
(First Embodiment)

Figure 1:
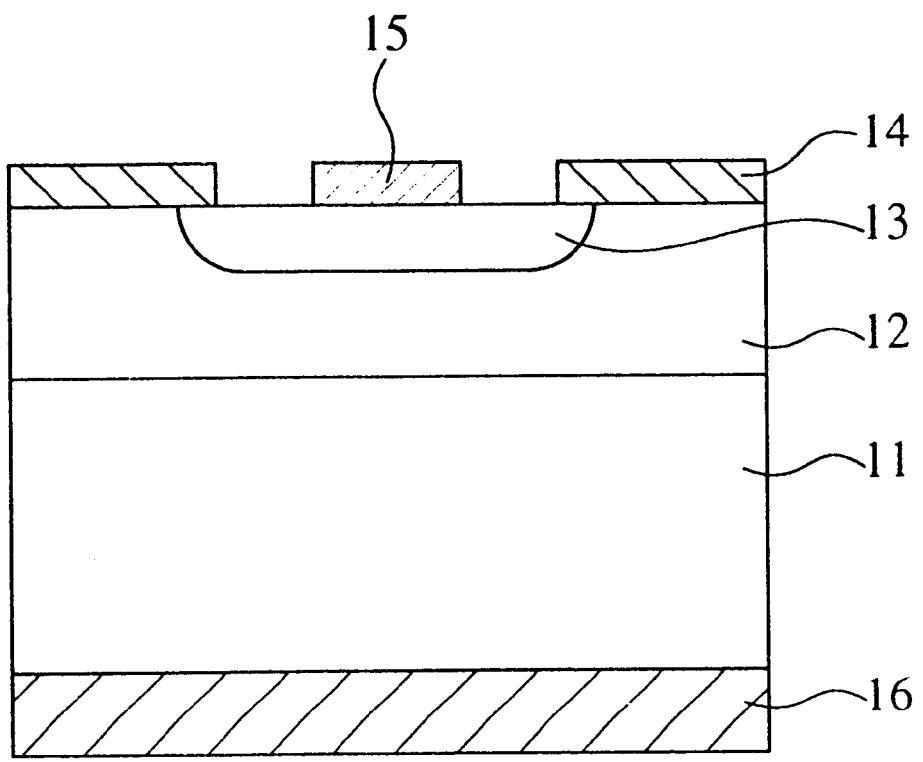
FIG. 1 is a cross sectional view illustrating a typical structure of a conventional LED.
Figure 2A:
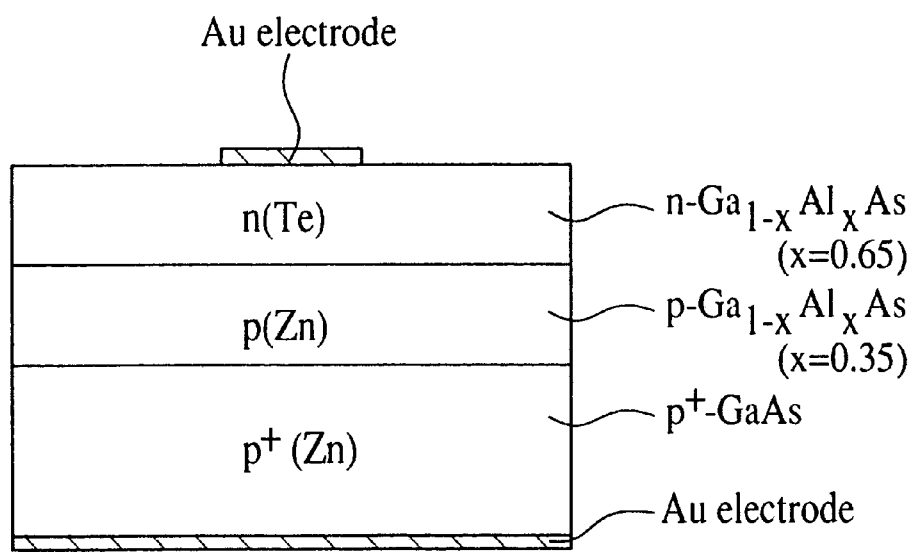
FIG. 2(A) is a schematic cross-sectional view illustrating the structure of a conventional LED employing a single heterostructure.
Figure 2B:
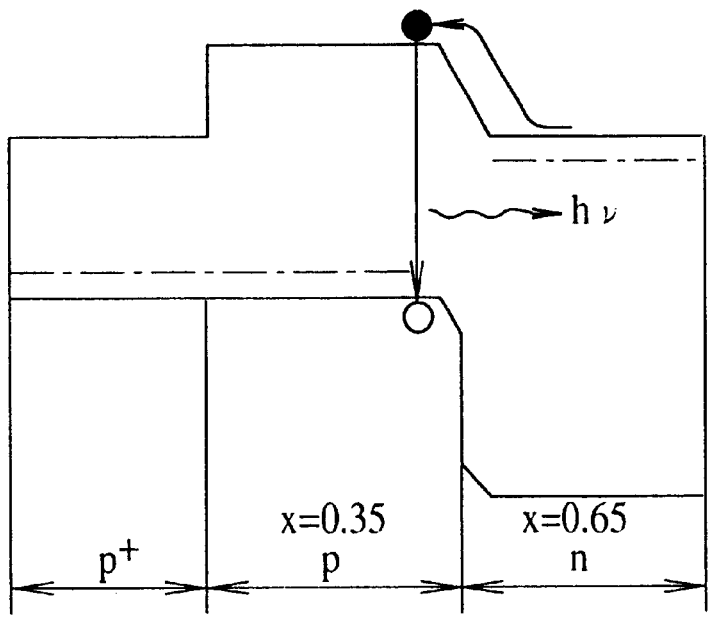
FIG. 2(B) is a diagram showing an example of its energy band gap in LED shown in FIG. 2(A)
Figure 3A:
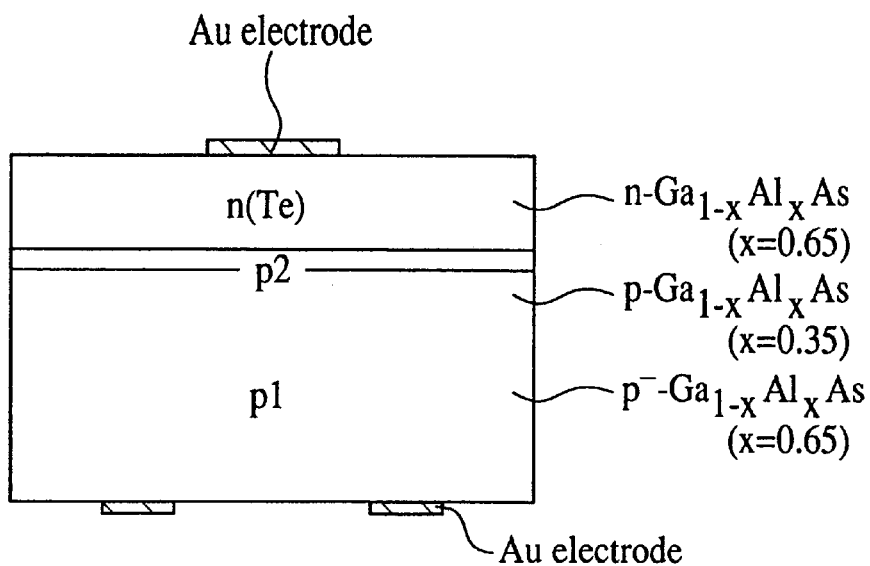
FIG. 3(A) is a schematic cross-sectional view illustrating the structure of a conventional LED employing a double heterostructure.
Figure 3B:
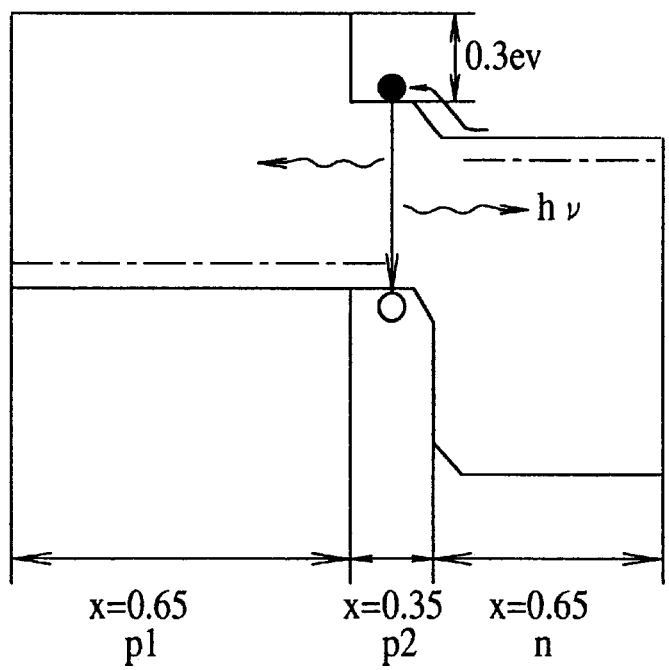
FIG. 3(B) is a diagram showing an example of its energy band gap.
Figure 4:
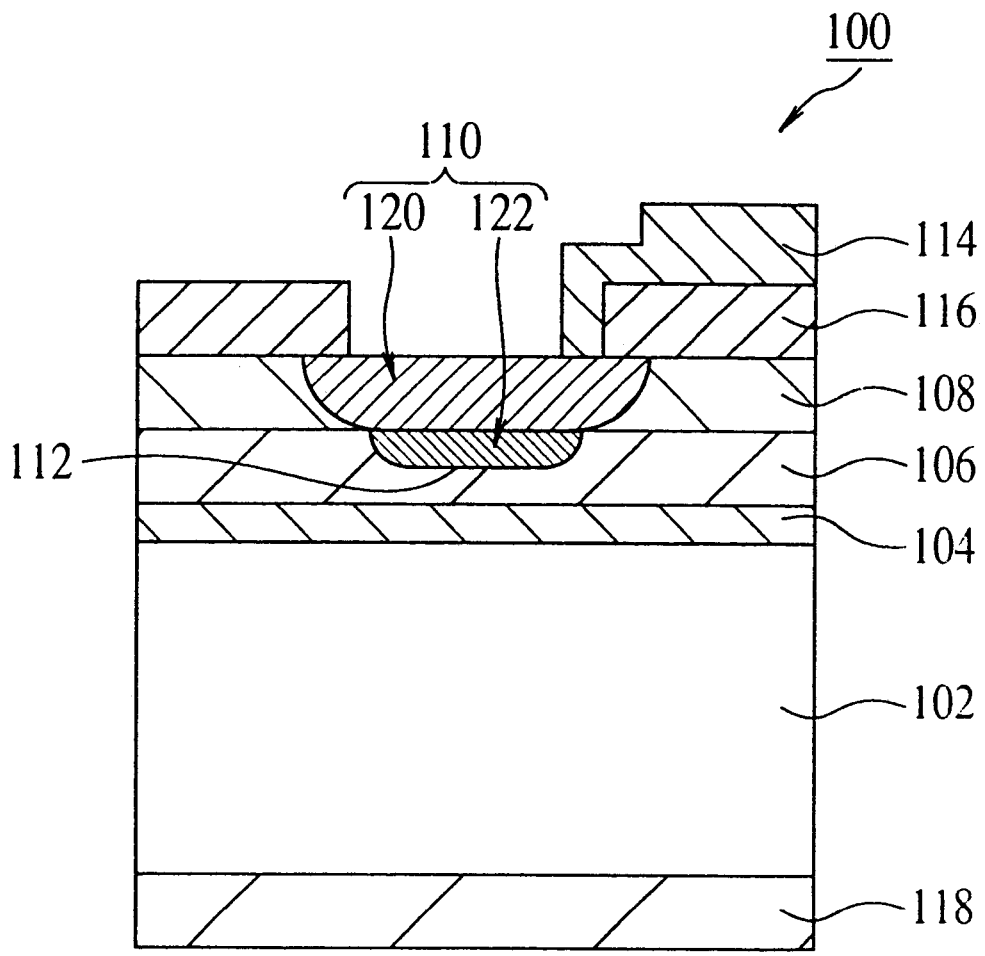
FIG. 4 is a cross-sectional view illustrating the basic structure of the LED of the first embodiment of the present invention.

FIG. 4 is a cross-sectional view illustrating the structure of the LED to which the first embodiment of the present invention pertains, while FIG. 5 is a cross-sectional view illustrating the structure of an LED array in which a plurality of the LEDs illustrated in FIG. 4 is arranged.

Figure 6:
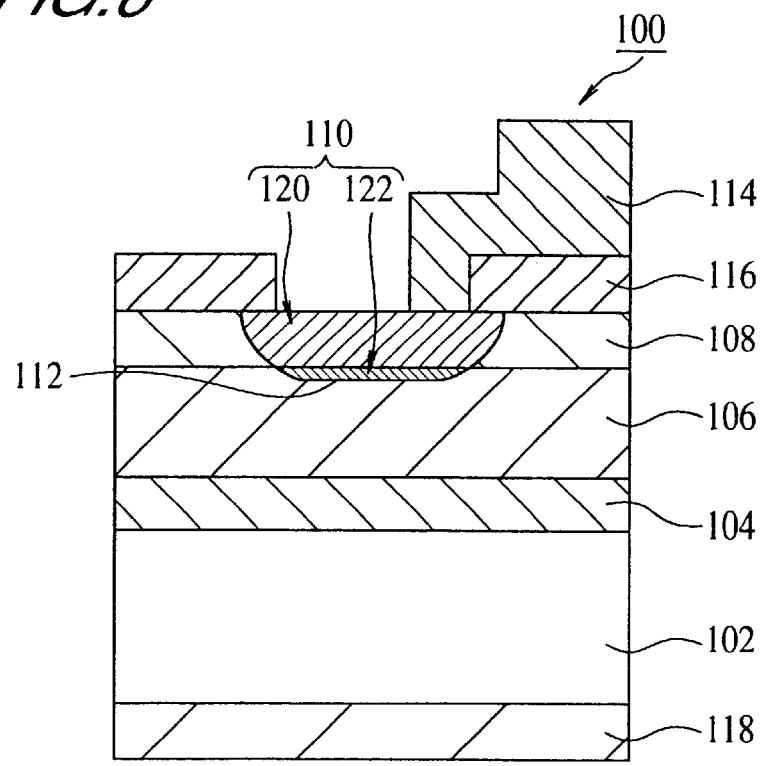
FIG. 6 is a cross-sectional view illustrating the basic structure of the above LED.

FIGS. 4 and 5 have been drawn in such a manner as to emphasise the difference in rate of diffusion between the first and second epitaxial layers. The cross-sectional shape of the diffusion area has been shown as differing at the boundary between the two epitaxial layers. In actual fact, as may be seen from FIG. 6, depending on the selection of the Al composition of the two epitaxial layers (values x and y) there may sometimes be no marked difference in the cross-sectional shape at the boundary between the two layers.

As shown in FIG. 4, an LED 100 comprises an n-type GaAs substrate 102, an n-type GaAs buffer layer 104 provided on the substrate 102, an n-type $Al_x Ga_{1-x} As$ layer (first epitaxial layer) 106 ($x \geq 0$) of thickness d1 epitaxially grown on the buffer layer 104, an n-type $Al_y Ga_{1-y} As$ layer (second epitaxial layer) 108 ($y>0$) of thickness d2 epitaxially grown on the layer 106. A p-type diffusion area 110 is formed in the first and second epitaxial layers 106, 108 by diffusing zinc (Zn). A diffusion front (p-n junction surface roughly parallel with the principal surface of the substrate 102) 112 of the selective diffusion area 110 is placed in the first epitaxial layer 106. A p-side electrode 114, an inter-layer insulating film 116 comprising for instance a SiN insulating film which forms a masking material for Zn diffusion, and a rear-face electrode 118 consisting for instance of a Au alloy are provided.

The Zn selective diffusion area 110 consists of a zinc selective diffusion area 120 formed within the second epitaxial layer 108 and a consecutive zinc selective diffusion area 122 formed within the first epitaxial layer 106.

The LED 100 is constructed so as to place the n-type GaAs buffer layer 104 on the n-type GaAs substrate 102, and laminate the first epitaxial layer 106 of thickness d1 and the second epitaxial layer 108 of thickness d2 on the buffer layer 104. The n-type GaAs buffer layer may be approximately 1000 Å in thickness. The ratio of the mixed crystals x, y is such that x<y. In other words, the energy band gap Eg1 of the first epitaxial layer 106 is smaller than the energy band gap Eg2 of the second epitaxial layer 108.

The LED 100 has a diffusion area 110 where the p-type impurity Zn is selectively diffused. The diffusion depth Xj, i.e. the distance from the upper surface of the second epitaxial layer 108 to the diffusion front 112 is such in relation to the thickness d2 of the second epitaxial layer 108 that d2<Xj<(d1+d2). Accordingly, the diffusion front 112 reaches the first epitaxial layer 106.

With regard to the electrodes 114, 118, ohmic electrodes are used, the p-side electrode 114 being for instance of an aluminum-type material, and the n-side electrode 118 for instance of a Au alloy. The p-side electrode 114 and the second epitaxial layer 108 are insulated by means of an interlayer insulating film 116. The inter-layer insulating film 116 is for instance a SiN film.

FIGS. 5(A) and (B) show an example where a plurality of the LEDs 100 are arranged. Specifically, FIG. 5(A) is a schematic plan view showing positional relationship between the electrode 114 and the area of impurities 110 in an LED array formed by the LEDs 100 and FIG. 5(B) is a cross-sectional view taken along the B—B line in FIG. 5(A). As seen from the FIGS. 5(A) and (B), the diffusion areas 104 are arranged at an equal pitch.

There follows a description of the method whereby LED arrays are manufactured by diffusing impurities selectively on to a laminated structure.

In the example cited, Zn is diffused on to a laminated structure having an $Al_x Ga_{1-x} As$ layer (first epitaxial layer 106) and an $Al_y Ga_{1-y} As$ layer (second epitaxial layer 108) (x, $\geq 0$, y>0, y>x)

FIGS. 4 and 5 illustrate typical shapes of the diffused area where Zn has been diffused on to a laminated structure. The Zn selectively diffused area is formed by diffusing Zn on to the n-type first epitaxial layer 106 and the n-type second epitaxial layer 108. The mixed crystal ratio y of the second epitaxial layer 108 is greater than the mixed crystal ratio x of the first epitaxial layer 106. It is known that the diffusion rate of Zn on to $Al_x Ga_{1-x}$ As increases with increasing the mixed crystal ratio x. Hence, where y>x, the diffusion length in the lateral (horizontal) direction is greater for the second epitaxial layer 108 than for the first epitaxial layer 106.

Referring to FIGS. 4 and 5, an example wherein the selected values are x=0.1, y=0.35, will be explained.

For instance, it may be predicted that if x=0.1, y=0.35 and the diffusion temperature is in the region of 640° C., the rate of diffusion in the second epitaxial layer 108 will be approximately four times the rate of diffusion in the first epitaxial layer 106. For instance, where LEDs 100 are arranged in a row at a dot density of 1200 dpi, their pitch is approximately 21.2 $\mu$m. Where the diffusion orifice W1 is 5 $\mu$m and the minimum interval between adjoining diffusion areas (da) min is 10 $\mu$m, the diffusion length X1 in the lateral direction must not be less than about 3 $\mu$m in order to prevent the adjoining LEDs 100 from short. The thicknesses of the first epitaxial layer 106 and the second epitaxial layer 108 are respectively d1 and d2, and the diffusion depth is Xj. Experiments conducted by the inventors of the present invention have shown that diffusion can be implemented in such a manner that the ratio β between the diffusion length in the lateral direction and the diffusion depth in a single mixed crystal comparison is approximately 1.

Accordingly, if the distance to the diffusion front in the lateral direction in the upper surface of the second epitaxial layer 108 is the diffusion length in the lateral direction X1, and the ratio of the rate of diffusion in the vertical direction (depth direction) to the epitaxial layer at the first epitaxial layer 106 and the second epitaxial layer 108 is α, then the following obtains.

$$(Lp=W1-da)/2 \geq X1[d2+\alpha \times (Xj-d2)] \times \beta \sim d2+\alpha \times (Xj-d2)$$

Lp is the dot pitch. Consequently, if for instance X1 is 3 $\mu$m, Xj is 1 $\mu$m and α is 4, d2 may be designed as follows.

$$Xj>d2=(\alpha \times Xj-X1)/(\alpha-1)=(4 \times 1-3)/(4-1) \sim 0.3 \ \mu m$$

If d2=0.3 $\mu$m and Xj=1 $\mu$m, the thickness d1 of the first epitaxial layer 106 should be at least 0.7 $\mu$m, e.g. d1=1 $\mu$m.

Conversely, if the design is such that d2=0.3 $\mu$m and d1=1 $\mu$m, there is no need for Xj to be 1 $\mu$m, and it may be determined within the range 0.3 $\mu$m<Xj<1.3 $\mu$m, i.e. the thickness d2 of the second epitaxial layer<Xj<(epitaxial layer thickness d1+epitaxial layer thickness d2) in such a manner that the following obtains.

$$(Lp-W1-da)/2 \geq X1=[d2+\alpha \times (Xj-d2)] \times \beta$$

Thin epitaxial layers of this sort can be manufactured with precision and uniformity over a wide substrate area by means of MOCVD (organic metal vapour-phase epitaxial growth method) or MBE (molecular beam epitaxy).

Figure 7:
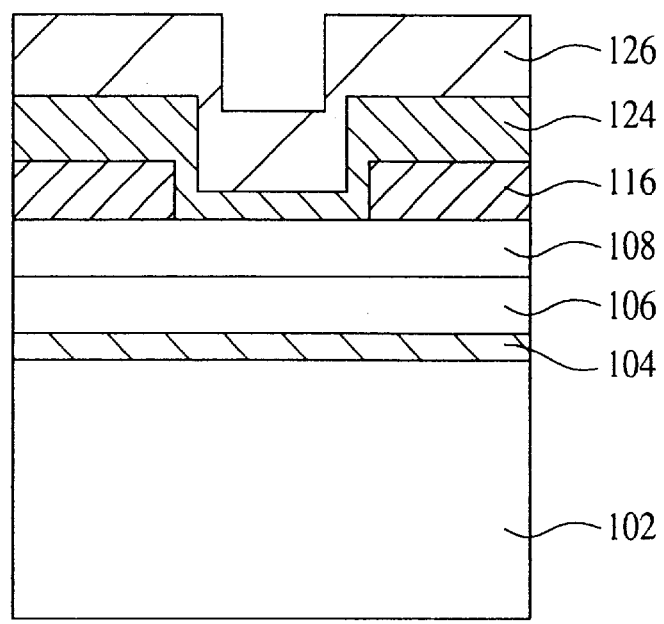
FIGS. 7–9 are cross-sectional views for explaining the method of manufacturing the LED shown in FIG. 4.
Figure 8:
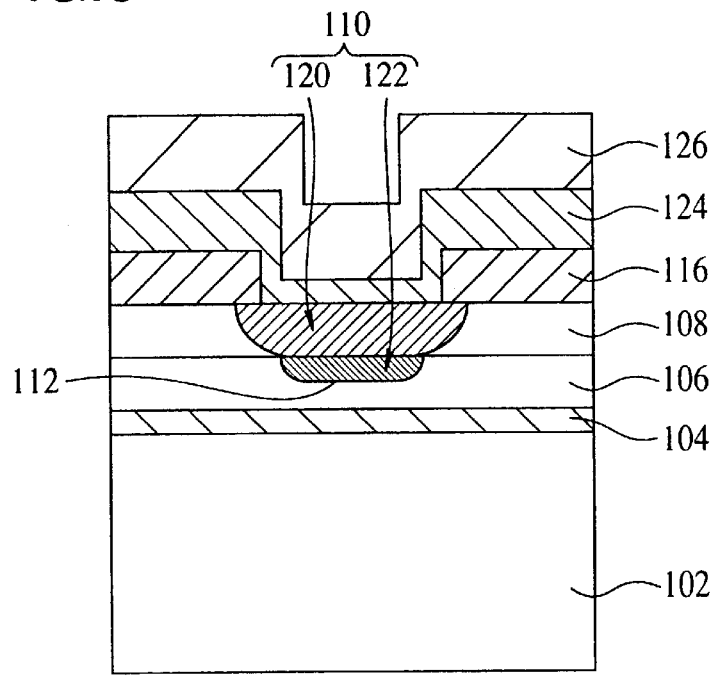
Figure 9:
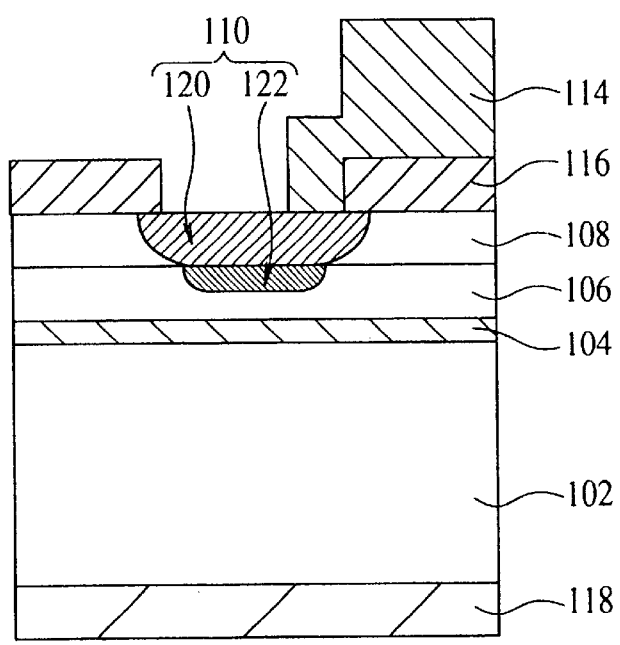

FIGS. 7–9 are cross-sectional views for explaining the method for manufacturing the above LED arrays.

On an epitaxial layer structure as described above is formed an insulating layer 116 with an orifice. An oxide film (diffusion source film) 124 containing Zn and an insulating film (cap film) 126 for the purpose of preventing dispersal of the Zn are formed on the layer 116, are shown in FIG. 7.

Next, as shown in FIG. 8, the wafer (substrate) is placed in an annealing oven in an atmosphere of nitrogen, and diffusion is implemented. Experiments conducted by the inventors have shown the optimum diffusion temperature to be in the range 500–650° C. Diffusing at this temperature makes it possible to precisely control the desired diffusion depth. The diffusion time may be set according to the desired Xj.

After diffusion, the diffusion source film 124 and cap film 126 are removed as illustrated in FIG. 9, and an electrode (p-side electrode) 114 with an ohmic contact is formed on part of the surface of the diffused area. Once the Al-type metal has been applied as a film by means of EB vaporisation, the electrode material is patterned into an electrode by the standard methods of photolithography and etching. After formation of the electrode pattern the wafer is sintered in order to obtain a good ohmic contact. An n-type electrode 118 is formed similarly by applying an Au-type metal as a film by EB vaporisation to the bottom surface of the substrate 102, and sintering the wafer in order to obtain a good ohmic contact. In this manner the LED array is completed.

There follows a description of the operation of the LED array, which is structured as explained above.

Figure 10:
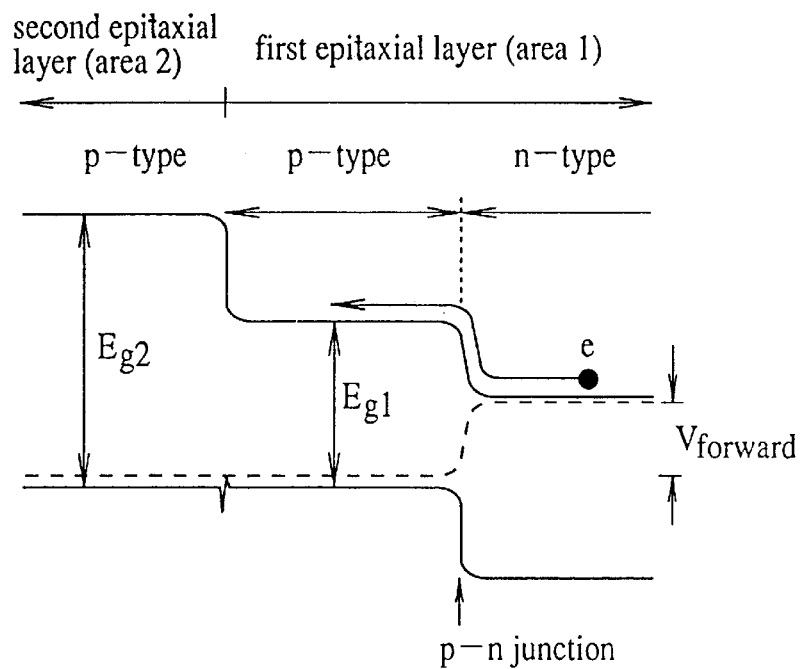
FIG. 10 is a diagram illustrating a typical energy band chart obtained when voltage is impressed in a forward direction on the LED shown in FIG. 4.

FIG. 10 is a diagram illustrating a typical energy band chart obtained when voltage is impressed on the LED of the above light-emitting element array in a forward direction. It should be understood that FIG. 10 is merely for the purpose of explaining in outline the principle behind the action, and it does not show the finer points of the structure, such as the lack of continuity in the energy band at the boundary of the first epitaxial layer 106 and the second epitaxial layer 108.

In FIG. 10, the energy band gap of area 2 (the area of the second epitaxial layer 108) is larger than that of area 1 (the area of the first epitaxial layer 106). The p-n junction is formed within the first epitaxial layer 106, i.e. within area 1.

Because the energy band gap of the second epitaxial layer 108 is larger than that of area 1, an energy barrier exists at the boundary of the first and second epitaxial layers 106, 108. Consequently, with regard to the direction perpendicular to the laminated surface of the semiconductor epitaxial layer, electrons injected into the Zn dispersion area are prevented from diffusing to area 2. Thus it is possible to contain or trap injected carriers with respect to the direction perpendicular to the principal surface of the substrate (direction in which the epitaxial layers 106 and 108 are laminated), and the density of electrons injected into area 1 is very high in comparison with what it is if no area 2 was present. This means that there is an increase in the number of electrons which recombine with holes, and in the intensity of the light generated as a result of this recombination.

The fact that the p-n junction is located on the diffusion front 112 of the diffusion area 110 means that it is formed not only in area 1, but also in area 2, as a diffusion front in the lateral direction. The electron flow density Je, when voltage in a forward direction is impressed on the p-n junction, is obtained by the following formula.

$$Je=-qK \ exp[-qVD/kT](exp[qV/kT]-1)$$

q is the electric charge, VD is the diffusion potential, V is the impressed voltage, k is Boltzmann's constant, T is the temperature in Kelvin, and K is the constant of proportionality. If V is constant, Je is in inverse proportion to the diffusion potential VD. Holes may be considered in the same manner.

If the diffusion potential VD1 of the p-n junction which is formed on the first epitaxial layer 106 and the diffusion potential VD2 of the p-n junction which is formed on the second epitaxial layer 108 are compared, and it is assumed that the Fermi level in the n-type and p-type areas respectively is approximately the same as the energy level at the base of the conduction band and top of the valence band, then VD1~Eg1, VD2~Eg2. Thus, in the structure to which the present embodiment pertains, VD1<VD2. In other words, the current density which flows through the p-n junction formed within the first epitaxial layer 106 is much larger than the current density which flows through the p-n junction formed within the second epitaxial layer 108. There follows an explanation of this using concrete numerical values.

For instance, if x=0.1, y=0.35, Eg2−Eg1~0.3 eV. Therefore, if the ratio between the current density J1 which flows through the p-n junction formed within the first epitaxial layer 106 and the current density J2 which flows through the p-n junction formed within the second epitaxial layer 108 is determined with VD2−VD1~0.3 eV, it can be predicted to be:

$$J2/J1 \exp[qV2/kT]/exp[-qV1/kT] = exp[-q(V2-v1)/kT] \sim 10^5 << 1$$

In other words, substantially all the electron flow is injected through the p-n junction formed within the first epitaxial layer 106. Thus, injection of the carrier occurs almost entirely through the p-n junction formed within the first epitaxial layer 106, and electron-hole recombination can be made to occur predominantly within the first epitaxial layer 106. Consequently, an optical spectrum is obtained where the light-emitting wavelength is almost equal to the energy band gap Eg1 of the first epitaxial layer 106. Since the energy band gap Eg2 of the second epitaxial layer 108 is greater than the energy band gap of the light generated within the first epitaxial layer 106, the light generated within the first epitaxial layer 106 is not absorbed by the second epitaxial layer 108 which acts as a window.

With this type of structure, it is possible to control the spread of the p-type area in the second epitaxial layer 108 during selective diffusion, to ensure that each LED is insulated, and thus to produce a high-density LED array.

Even if the first epitaxial layer 106 is so thin as to be less than the mean free path of the electrons, it is possible to prevent diffusion by means of the energy barrier at the boundary between the first epitaxial layer 106 and the second epitaxial layer 108. Thus there is no large loss of light-emitting efficiency as when no second epitaxial layer 108 is present, and it is possible to reduce the thickness of the first epitaxial layer 106 in accordance with the precision of diffusion depth control. Reducing the thickness of the first epitaxial layer 106 allows the density of injected electrons to be increased accordingly, thus improving the light-emitting efficiency.

As has been described above, the LED array to which the present embodiment pertains is provided with an n-type GaAs substrate 102 above which formed is an n-type $Al_x Ga_{1-x}$ As layer (first epitaxial layer) 106 ($x \geq 0$) of thickness d1 and an n-type $Al_y Ga_{1-y}$ As layer (second epitaxial layer) 108 (y>0) of thickness d2. A p-type diffusion area 110 is formed in the first and second epitaxial layer 106, 108 by diffusing zinc (Zn). A diffusion front 112 of the diffusion area 110 exists within the first epitaxial layer 106. A p-side electrode 114, an inter-layer insulating film 116, and an n-side electrode 118 are provided. It is structured in such a manner that the energy band gap Eg1 of the first epitaxial layer 106 is smaller than the energy band gap Eg2 of the second epitaxial layer 108 (Eg1<Eg2), while a p-type diffusion area deeper than the thickness of the second epitaxial layer 108 is formed selectively on the laminated structure of the thin n-type first epitaxial layer 106 and second epitaxial layer 108 so as to fulfil the conditions of thickness of the first epitaxial layer 106 and second epitaxial layer 108, namely (Lp−W1−da)/2≧X1=[d2+α×(Xj−d2)]×β and d2<Xj<(d1+ d2). This allows the injected electron density to be increased, and the light-emitting efficiency to be improved. Moreover, since it is possible to contain the injected electrons by means of the energy barrier at the boundary of the first epitaxial layer 106, the first epitaxial layer 106 can be thinner than the mean free path of the electrons. This means that all the epitaxial layers can be thinner.

Because the selective diffusion depth can be reduced, it is possible to restrict the Zn diffusion length in the lateral direction within the second epitaxial layer 108, thus permitting the manufacture of LED arrays with an ultra-high density in the range of 1200 dpi without short of the individual LEDs arranged in a row.

Moreover, because Zn diffusion is implemented in the solid phase, it can be controlled accurately even where the diffusion depth is small.

(Second Embodiment)

Figure 11:
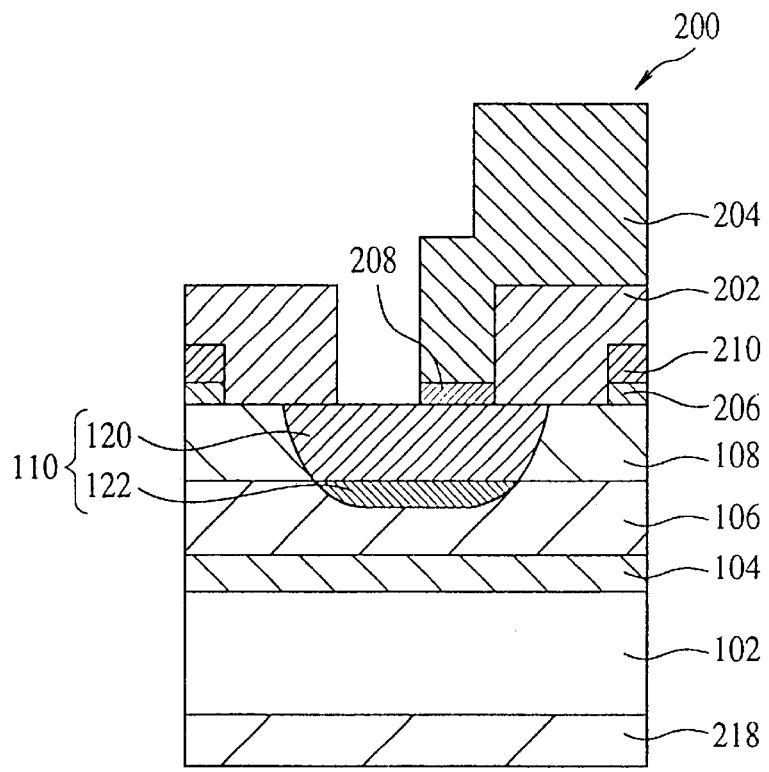
FIG. 11 is a cross-sectional view of an LED of the second embodiment of the present invention.

FIG. 11 is a diagram illustrating the typical structure of an LED 200 in the LED array of the second embodiment of the present invention. In the description of the second embodiment, those structural parts which are the same as in FIG. 4 have been designated by the same reference numerals. As in the case of FIG. 4, FIG. 11 has been drawn in such a manner as to emphasise differences in the speed of Zn diffusion between the layers.

As shown in FIG. 11, LED 200 comprises an inter-layer insulating film 202, a p-side electrode (e.g. Al-type electrode) 204, an n-type GaAs layer 206, the Zn diffusion area of the GaAs layer (or area) 208, which is formed by the selective diffusion of Zn within the n-type GaAs layer. There is no p-n junction present in the Zn-diffused GaAs layer 208, which is electrically connected at least to the Zn diffusion area 120 of the second epitaxial layer 108. If there were a p-n junction present in the Zn-diffused GaAs layer 208 which is electrically connected to the Zn diffusion area 120 of the second epitaxial layer 108, a forward-direction current would flow through it when impressed on the LED 200, as a result of which light emitted from the GaAs layer 208 would become the principal light, and the LED 200 would not function with high light-emitting efficiency of the desired light-emission wavelength corresponding to the energy band gap of the semiconductor of the first epitaxial layer 106.

In the LED 200 shown in FIG. 11, the Zn-diffused GaAs layer 208 which is electrically connected to the Zn diffusion area 120 of the second epitaxial layer 108 is formed in the shape of islands, and is completely separated from the n-type GaAs layer. In other words, the present embodiment is of a structure wherein there is no p-n function present within the GaAs layer above the second epitaxial layer 108. All or part of the GaAs layer 208 placed in the orifice defined by the interlayer insulation film 202 forms an ohmic contact with the p-side electrode 204.

The GaAs layers 206, 208 may be formed approximately 500 A in thickness. There is no area of contact between the Zn-diffused GaAs layer area 208 and the n-type GaAs area 206 which is not Zn-diffused, so that, the area 208 is isolated from the area 206 in the shape of islands. In other words, the structure is such that there is no p-n junction on which voltage is impressed in the forward direction within the GaAs layer 208 which forms an ohmic contact with the p-side electrode 204. There is not any p-n junction in the GaAs layer 206. In the laminated structure beneath the GaAs layers 206, 208, the energy band gap of the second epitaxial layer 108 being greater than that of the first epitaxial layer 106, and the diffusion front 112 of the diffusion area 110, i.e. the surface of the p-n junction which is more or less parallel with the principal surface of the substrate 102, is within the first epitaxial layer 106, same as in the LED of the first embodiment.

There follows a description of the method of manufacturing the LED 200.

Figure 12:
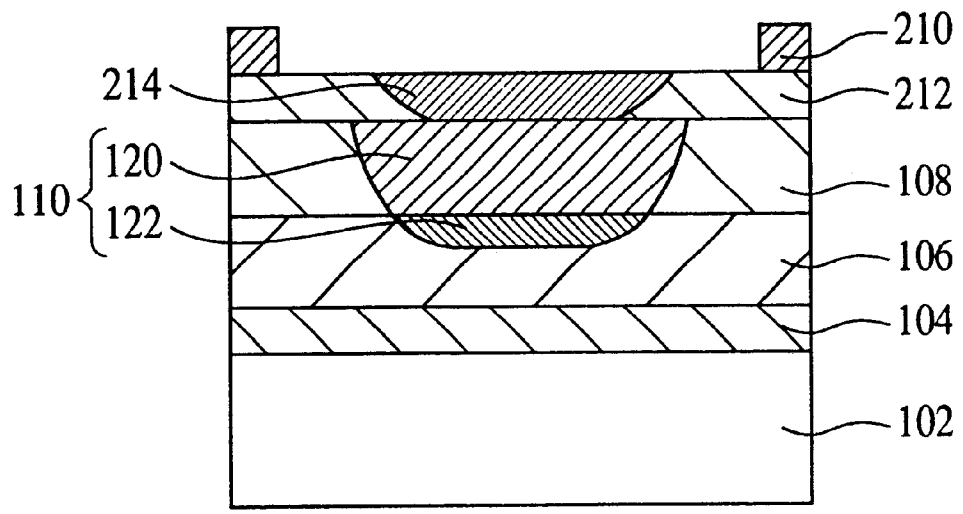
FIGS. 12–14 are cross-sectional views for explaining the method of manufacturing the LED shown in FIG. 11.
Figure 13:
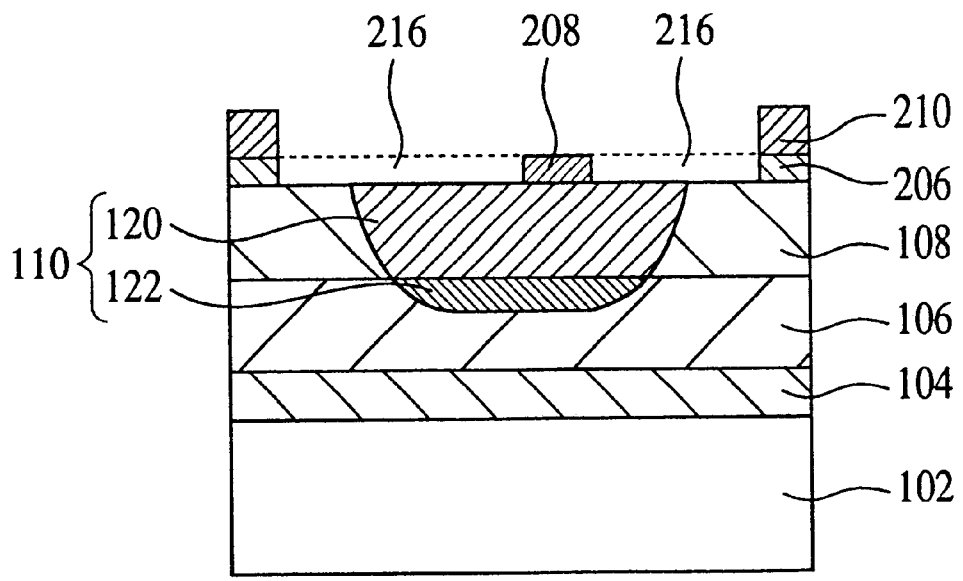
Figure 14:
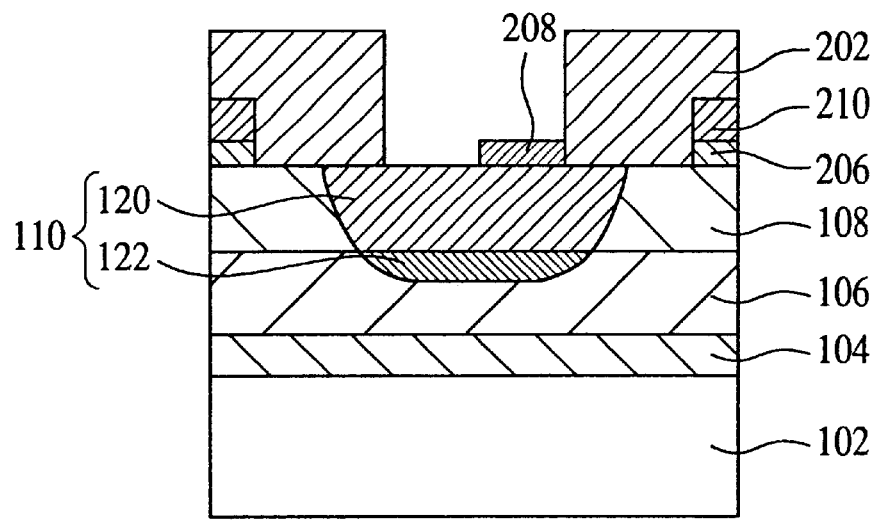

FIGS. 12–14 are cross-sectional views for explaining the method of manufacturing the above LED 200.

First, Zn is diffused selectively on the substrate 102 by the same manufacturing process as in the first embodiment (see FIG. 12). The structure shown in FIG. 12 comprises a diffusion mask 210, an n-type GaAs layer 212, and a Zn-diffused GaAs area 214.

Next, the p-n junction formed between the n-type GaAs layer 212 and the Zn-diffused GaAs area 214 on the second epitaxial layer 108 is removed so that the Zn-diffused GaAs area 208 remains in the shape of islands. Thus, a p-n junction on which voltage is impressed in the forward direction is deleted from the GaAs layer in this process:

1) an insulating film which covers the GaAs layer 212 is partially removed to form diffusion orifice in such a manner that the surface of the GaAs layer is exposed more widely than the diffusion orifice, and the surface of the diffused area is completely exposed.
2) Then, the p-n junction area formed between the diffused GaAs layer 214 and the n-type GaAs layer, part of the n-type GaAs layer area 212 on the periphery of the p-n junction area within the GaAs layer, and part of the Zn-diffused GaAs layer area 214 on the periphery of the p-n junction area within the GaAs layer are removed by etching to form a Zn-diffused island-shaped GaAs layer area 208 on the second epitaxial layer 108. The island-shaped GaAs area 208 is formed in such a manner that at least part of the area is located within the diffusion orifice or within the inter-layer insulating film orifice. At least part of the island-shaped GaAs area 208 forms an ohmic contact with the p-side electrode 204. If wet etching is employed in the process whereby the p-n junction formed within the GaAs layer is removed by etching, this may be implemented with a solution of phosphoric acid and hydrogen peroxide in water.

The method of manufacture is immaterial provided that part of the GaAs layer including the p-n junction area is removed (the area which has been removed by etching denoted as 216 in FIG. 13), so that the GaAs area 208 remains in the shape of islands within the diffusion orifice or inter-layer insulating film orifice, at least a part of the area 208 forms ohmic contact, and the island-shaped Zn-diffused GaAs area 208 is isolated electrically from the p-n junction area formed within the GaAs layer. Conventional photolithography techniques are employed in this process.

Next, the inter-layer insulating film 202 is formed as illustrated in FIG. 14, in such a manner that the electrode 204 and the n-type area 206 do not short.

Figure 15:
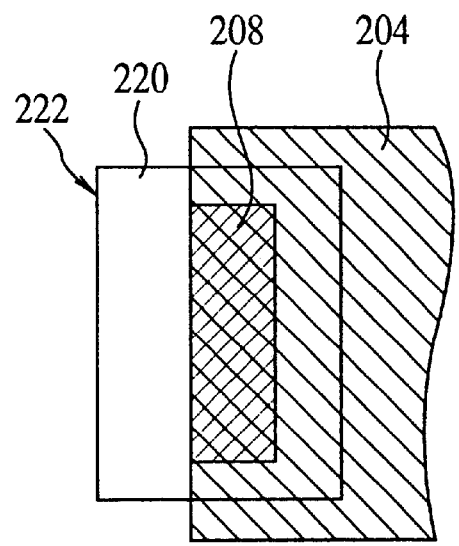
FIG. 15 is a schematic plan view showing an orifice area of the LED shown in FIG. 11.

Then, the p-side electrode 204 and the n-side electrode 218 are formed. The p-side electrode 204 makes electrical contact with the Zn-diffused GaAs area 208, as illustrated in FIG. 15.

In this manner the LED 200 is completed.

Then the operation of the LED 200 will be described.

Whatever the Al composition of the second epitaxial layer 108, the fact that there is a GaAs layer on the second epitaxial layer 108 means that a good ohmic contact can easily be obtained with the aid of, for instance, an Al electrode.

When the second epitaxial layer of $Al_yGa_{1-y}As$ with large y is exposed to the atmosphere, ohmic contact cannot be formed with the p-side electrode owing to oxidation of Al in the $Al_yGa_{1-y}As$ layer.

A forward-direction voltage is impressed on the p-n junction by impressing a plus potential on the p-side electrode. There is no p-n junction present in the p-type GaAs layer 208, which has ohmic contact with the p-side electrode 204, and in the n-type GaAs layer 206, and there is no injection of electrons from the GaAs n-type area. Consequently, as was explained in relation to the first embodiment, electrons are injected into the p-type area chiefly via the p-n junction formed in the first epitaxial layer 106, and injected electrons are contained within the first epitaxial layer 106 in regard to the lamination direction of the epitaxial layers by the energy barrier which is formed at the boundary of the first and second epitaxial layers 106, 108. The I–V characteristic of the p-n junction of the first epitaxial layer 106 is reflected in the I–V characteristic of this LED element, and the surface GaAs layer has no effect on it. Accordingly, if a forward-direction voltage is impressed on this element, light is generated within the first epitaxial layer 106, and the wavelength of the light corresponds to the energy band gap of the semiconductor of the first epitaxial layer 106.

As has been explained above, the LED array of the second embodiment is structured in such a manner that a GaAs layer which is in contact with an electrode forming an ohmic contact is provided on the second epitaxial layer 108, and there is no p-n junction present in this GaAs layer. As a result, the electrical and light-emitting characteristics of the junction are not affected. Moreover, a good ohmic contact can easily be obtained without any effect on the composition of the second epitaxial layer 108.

It should be added that while in the second embodiment a GaAs layer has been provided, it is possible even with an $Al_x Ga_{1-x}$ As layer (x>0) with small ratio of mixed Al crystals to form an ohmic contact with ease, so that an $Al_x Ga_{1-x}$ As layer (x>0) with small ratio of mixed Al crystals may also be employed.

The inter-layer insulating film orifice area of the LED may be structured as described below.

Figure 16A:
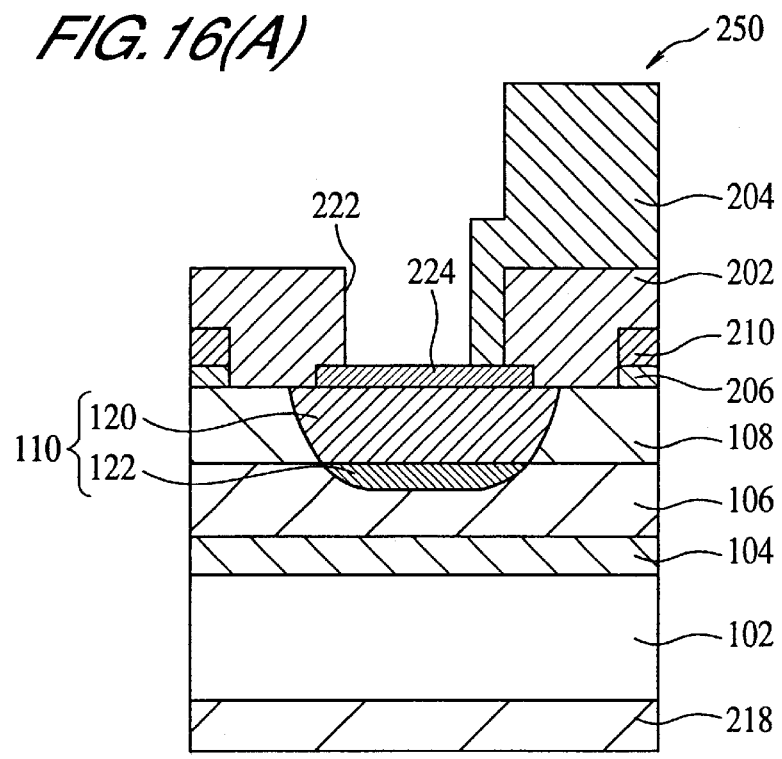
FIG. 16(A) is a schematic cross-sectional view showing an LED of a variation of the second embodiment of the present invention and FIG. 16(B) is a schematic cross-sectional view taken along B–B' line in FIG. 16(A)
Figure 16B:
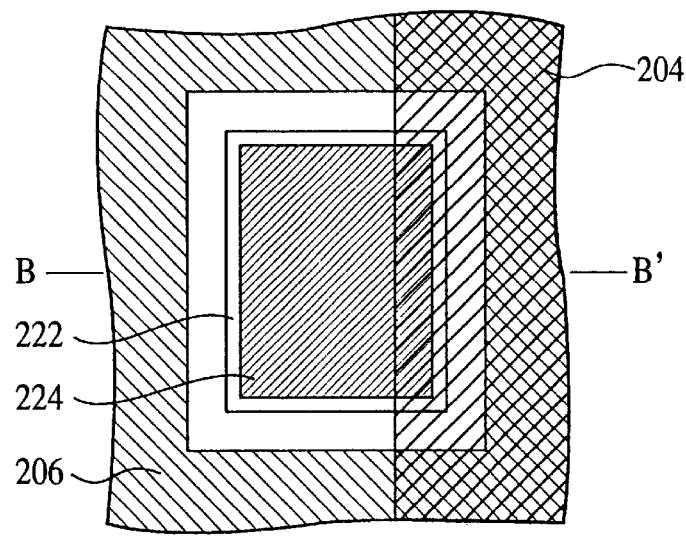

FIG. 15 is a diagram illustrating typical structures of the orifice area of the above light-emitting element 200. FIG. 16(A) is a schematic cross-sectional view showing an LED 250 of a variation of the second embodiment of the present invention. FIG. 16(B) is a schematic cross-sectional view taken along B–B' line in FIG. 16(A).

In FIG. 15, 220 denotes a light-emitting area, and 222 denotes an orifice defined by the inter-layer insulation film.

In the second embodiment, the GaAs layer 208 in the inter-layer insulating film orifice 222 is provided so as to be covered with the p-side electrode 204, as shown in FIG. 15. Alternatively, the GaAs layer 224 may be provided in other areas of the inter-layer insulating film orifice 222, as shown in FIGS. 16 (A), (B), if the GaAs layer is so thin that there is little reduction in the amount of light due to absorption therein.

Figure 17:
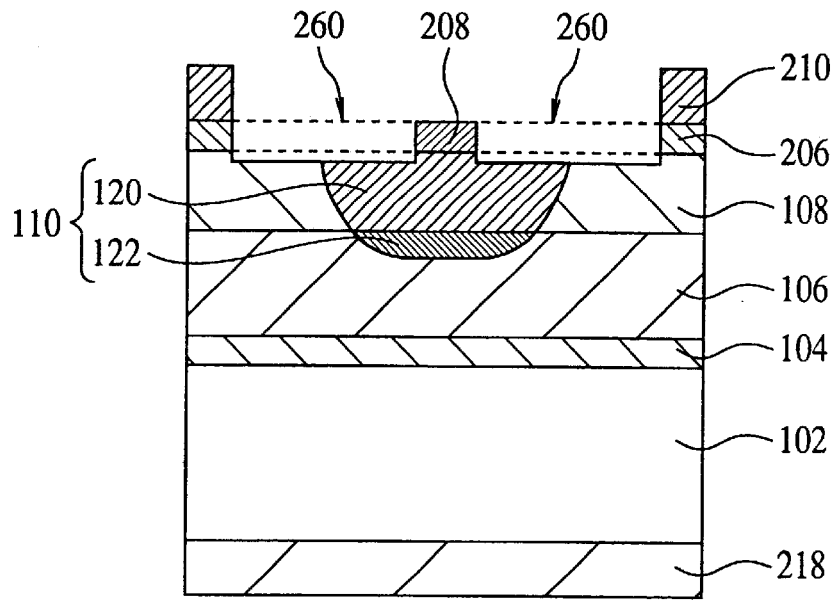
FIG. 17 is a cross-sectional view showing a modification of the second embodiment of the present invention.

It is clear that provided the structure of the interlayer insulating film is such that the p-side electrode 204 and the n-type epitaxial layer 206 do not short, the relative positions of the GaAs layer area formed in the shape of islands within the diffusion area and the inter-layer insulating film orifice 222 are not restricted to the examples illustrated in FIGS. 11–16. Although in the second embodiment only the GaAs layer 208 in the inter-layer insulating film orifice 222 has been isolated from the surrounding GaAs layer 206, the area 260 for isolating the GaAs layer 208 from the surrounding GaAs layer 206 may include the second epitaxial layer 108, as shown in FIG. 17.

(Third Embodiment)

Figure 18:
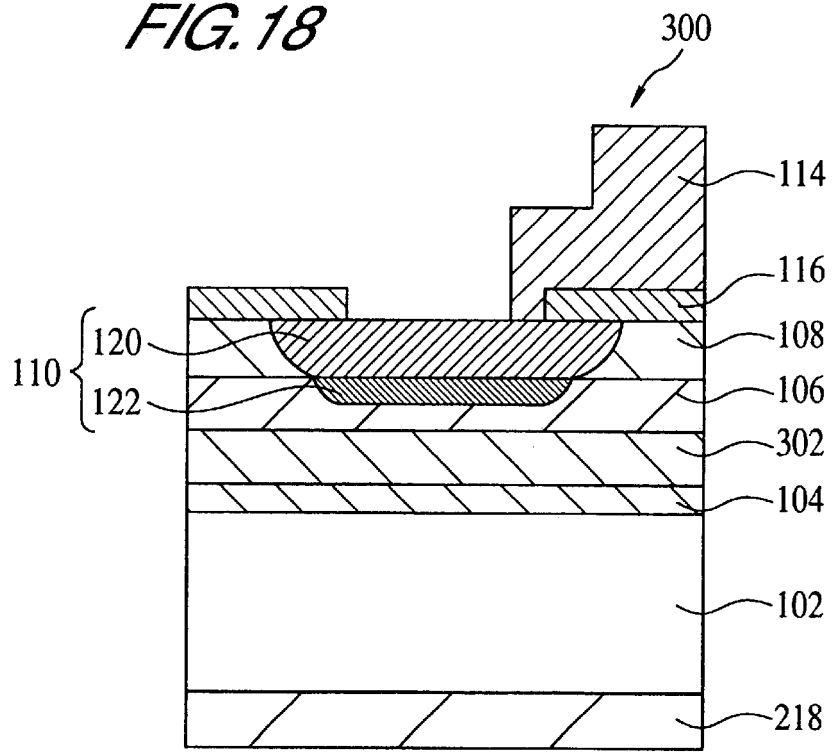
FIG. 18 is a cross-sectional view showing an LED of the third embodiment of the present invention.

FIG. 18 is a cross-sectional view showing the LED 300 of the third embodiment of the present invention. In the description, elements which are the same as in FIG. 4 are designated by the same numerals.

As shown in FIG. 18, LED 300 comprises an n-type $Al_zGa_{1-z}As$ layer 302 (third epitaxial layer) (z>0). On the n-type GaAs substrate 102 is formed an n-type GaAs buffer layer 104, on which is formed in turn the n-type $Al_zGa_{1-z}As$ layer 302 (third epitaxial layer) (z>0). On the third epitaxial layer 302 are formed by epitaxial growth the n-type $Al_xGa_{1-x}As$ layer (first epitaxial layer) 106 and the n-type $Al_yGa_{1-y}As$ layer (second epitaxial layer) 108, so that the structure has three n-type epitaxial layers. Here, the relationship between x, y and z is as follows: y>x, z>x.

The diffused area, which is formed by selective diffusion in the same manner as in the first embodiment, has a diffusion front locating in the first epitaxial layer.

For instance, the value of x and y in the first epitaxial layer 106 and second epitaxial layer 108 may be x=0.1, y=0.35 as in the first embodiment, while the value z in the third epitaxial layer 302 may be z=0.35. Since the third epitaxial layer 302 has no p-n junction resulting from diffusion, light is generated only in the first epitaxial layer 106 as in the first embodiment. The electric characteristics of the junction formed in the first epitaxial layer 106 are dominant also.

There is a p-side electrode (for instance, Al electrode) 114 having contact with the diffusion area, and an n-side electrode (bottom surface electrode) 218 having contact with the bottom surface of the substrate 102.

The LED 300 may be manufactured by the same method as the first embodiment.

The operation of the LED 300 will be described.

Figure 19:
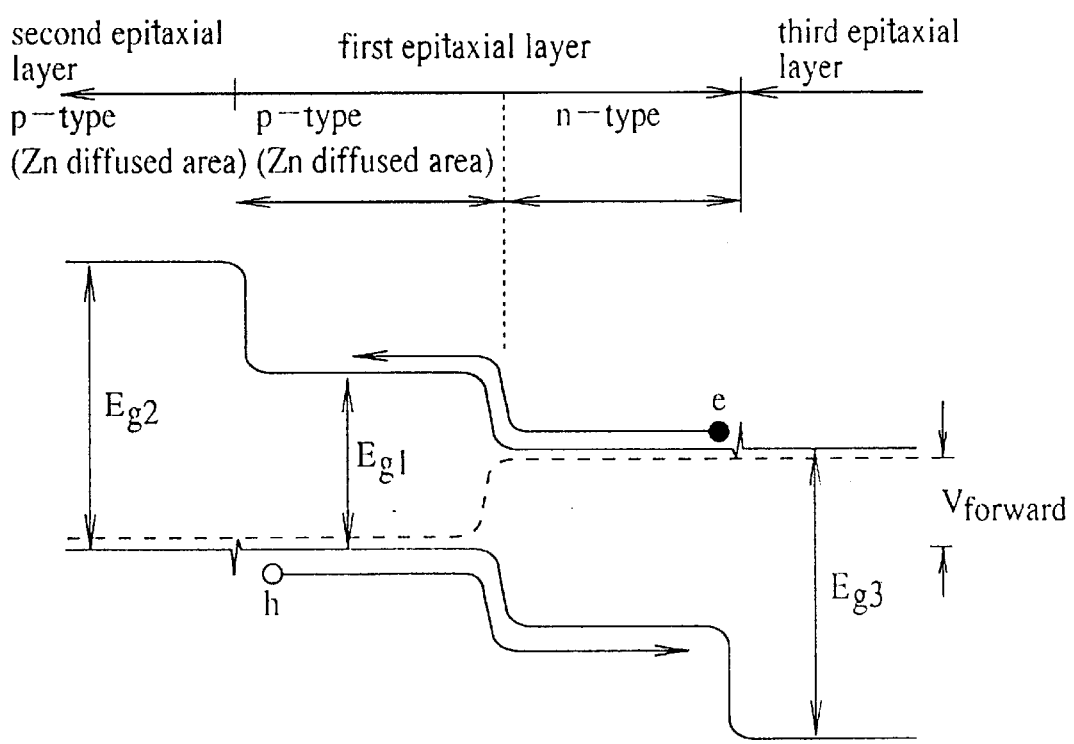
FIG. 19 is a diagram illustrating a typical energy band chart obtained when voltage is impressed in a forward direction on the LED shown in FIG. 18.

FIG. 19 is a diagram illustrating a typical energy band chart obtained when voltage is impressed on the LED of the above light-emitting element array in a forward direction. It should be noted that FIG. 19 is merely for the purpose of explaining in outline the principle behind the operation, and it does not show the finer points of the structure, such as the lack of continuity in the energy band at the boundary of the first epitaxial layer and second epitaxial layer.

When forward-direction voltage is impressed on the junction, electrons are injected into the p-type area via the p-n junction formed in the first epitaxial layer 106, where the diffusion potential is low. Holes also are injected into the n-type are a via the p-n junction formed in the first epitaxial layer 106, where the diffusion potential is low. The electrons which have been injected into the p-type area are prevented from diffusing to the second epitaxial layer 108 in the direction perpendicular to the principal surface of the substrate 102, i.e. the direction perpendicular to the laminated surface of the first and second epitaxial layers 106, 108, by the energy barrier which exists at the boundary between these epitaxial layers.

Meanwhile, the holes which have been injected into the ntype area are prevented from diffusing in the direction perpendicular to the principal surface of the substrate 102, i.e. the direction perpendicular to the laminated surface of the first and second epitaxial layers 106, 108, by the energy barrier which exists at the boundary between these epitaxial layers. Thus, the density of the injected electrons and holes increases greatly within the first epitaxial layer 106, and the likelihood of injected electrons recombining with majority carrier holes and producing light increases. Similarly, the likelihood of injected holes recombining with majority carrier electrons and producing light increases. As far as junctions formed in the lateral direction are concerned, there is no barrier in the lateral direction for the minority carrier injected from this area, but the injected area normally spreads over an area equal to or several times that of the mean free path, and almost all the carriers are recombined within the mean free path.

As explained above, the LED 300 of the third embodiment is structured in such a manner that an n-type GaAs buffer layer 104 is formed on the n-type GaAs substrate 102, and the third epitaxial layer 302 is formed thereon. On the $Al_zGa_{1-z}As$ layer (third epitaxial layer) 302 are formed by epitaxial growth the n-type $Al_xGa_{1-x}As$ layer (first epitaxial layer) 106 and the n-type $Al_yGa_{1-y}As$ layer (second epitaxial layer) 108, so that there are three epitaxial layers, the first epitaxial layer 106 with a small energy band gap being sandwiched between the second epitaxial layer 108 with a large energy band gap and the third epitaxial layer 302. Since the diffusion front, i.e. the p-n junction surface which is more or less parallel with the principal surface of the substrate 102, is within the first epitaxial layer 106 with the small energy band gap, the injected electrons and holes are prevented from diffusing by the energy barriers between the first epitaxial layer 106 and second epitaxial layer 108 and between the first epitaxial layer 106 and the third epitaxial layer 302. Thus, the carrier density within the first epitaxial layer 106 increases, and it is possible to realize a high light-emitting efficiency in the first epitaxial layer 106. A light-emission wavelength is obtained which is determined by the energy band gap of the semiconductor of the first epitaxial layer 106, while the electric characteristics obtained are determined by the p-n junction formed within the first epitaxial layer 106.

As in the case of the first embodiment, when LED array is produced by the LED 300, the fact that there is a p-n junction formed by a selective diffusion area in an n-type epitaxial laminated structure means that there is no need to separate the elements by mesa etching or other means, and an LED array with a completely monolithic structure can be formed. This makes it easy to produce ultra-high-density LEDs of 1200 dpi.

In the third embodiment, the third epitaxial layer 302 is a single layer, but this need not necessarily be so, and it may also be a multi-layer n-type structure with an $Al_zGa_{1-z}As$ layer in contact with the first epitaxial layer 106, followed by an $Al_qGa_{1-q}As$ layer/$Al_rGa_{1-r}As$ layer/ . . . (q, r$\geq$0).

Figure 20:
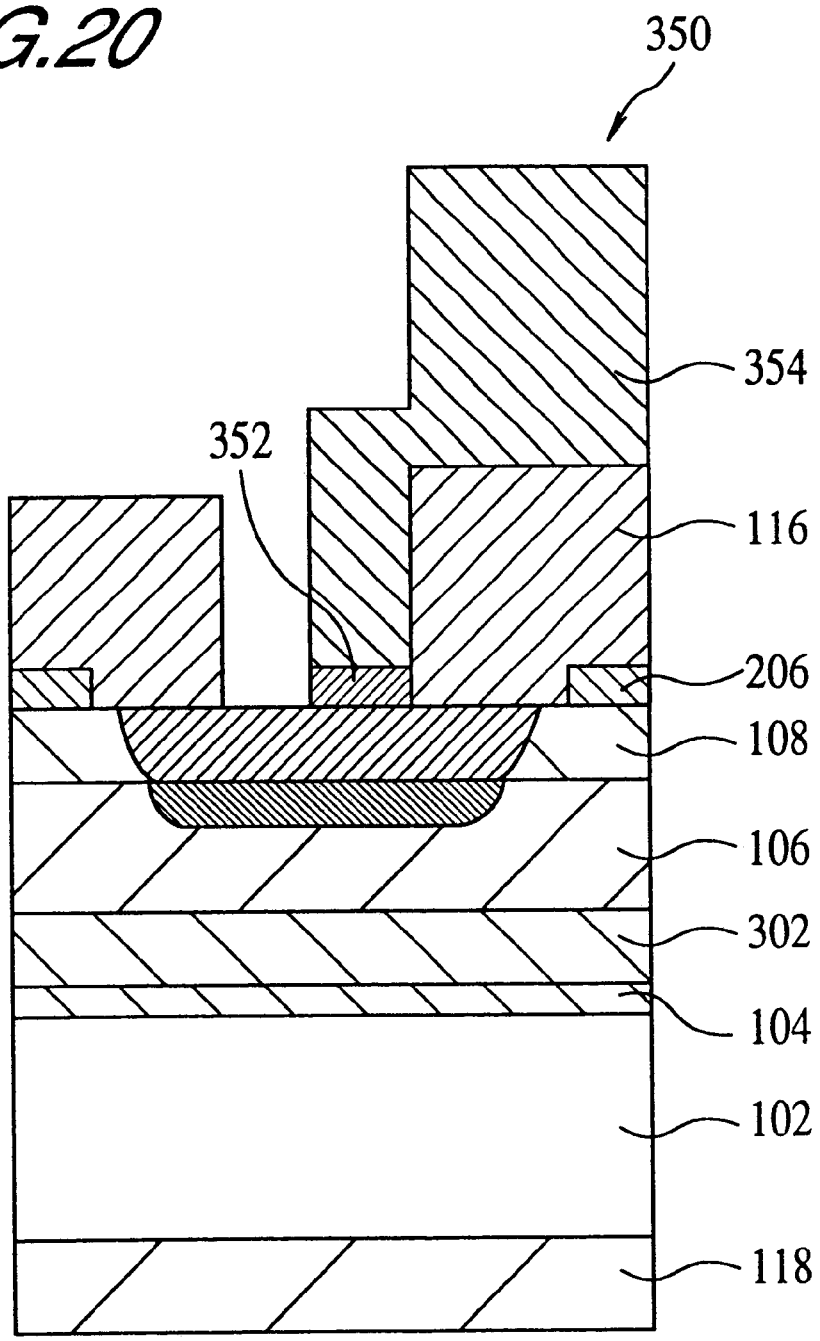
FIG. 20 is a cross-sectional view showing an LED of a modification of the third embodiment of the present invention.

FIG. 20 is a cross-sectional view illustrating LED 350 of a modification of the third embodiment. An n-type GaAs layer is formed on the $Al_yGa_{1-y}As$ layer (second epitaxial layer) 108. Then, a p-n junction is created by diffusing Zn selectively on to a laminated structure consisting of the n-type GaAs layer (fourth epitaxial layer)/n-type $Al_yGa_{1-y}As$ layer 108 (second epitaxial layer)/n-type $Al_xGa_{1-x}As$ layer 106 (first epitaxial layer)/n-type $Al_zGa_{1-z}As$ layer 302 (third epitaxial layer) in such a manner that the diffusion front is within the first epitaxial layer 106. At least the p-n junction area within the GaAs layer area formed on the GaAs layer (fourth epitaxial layer) is removed by etching to form an island-shaped Zn-diffused GaAs layer 352 within the diffusion orifice. Electrode contact 354 (ohmic contact) is formed on all or part of this island-shaped GaAs layer area 352. The relative positions of the inter-layer insulating film orifice and the island-shaped Zn-diffused GaAs layer area 352 are capable of the same modification as has been described in relation to the second embodiment.

The adoption of this kind of structure has the effect of enabling a good electrode contact to be formed on the p-side irrespective of the Al composition of the $Al_yGa_{1-y}As$ layer 108 (second epitaxial layer).

As has been stated in relation to the second embodiment, where the Al composition s is small, the Zn-diffused $Al_s Ga_{1-s}$ As layer (s>0) and p-side electrode 354 may form a low-contact resistance contact sufficient for use as an LED array. Accordingly, it is possible to use an $Al_s Ga_{1-s}$ As layer (s>0) instead of the GaAs layer on the Zn-diffused $Al_y Ga_{1-y}$ As layer.

Moreover, in all the above embodiments, a common electrode has been provided on the bottom surface of the substrate 102, but it is also possible to provide a common electrode on the same side as the p-side electrode and having contact with the bottom surface of the n-type GaAs layer.

Furthermore, in all the above embodiments, Al-type materials have been used for the p-side electrode, but Au-type and other materials may be used provided if it is possible to form an ohmic contact.

(Fourth Embodiment)

Figure 21:
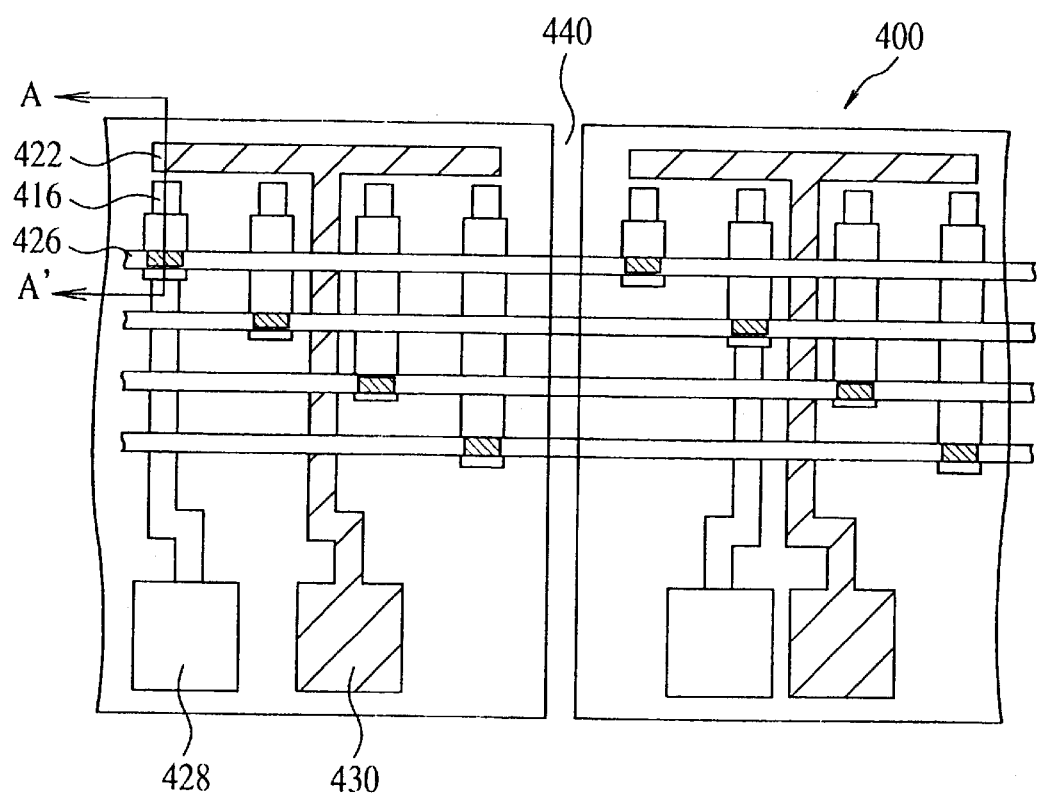
FIG. 21 is a diagram illustrating the basic structure of the LED array of the fourth embodiment of the present invention.
Figure 22:
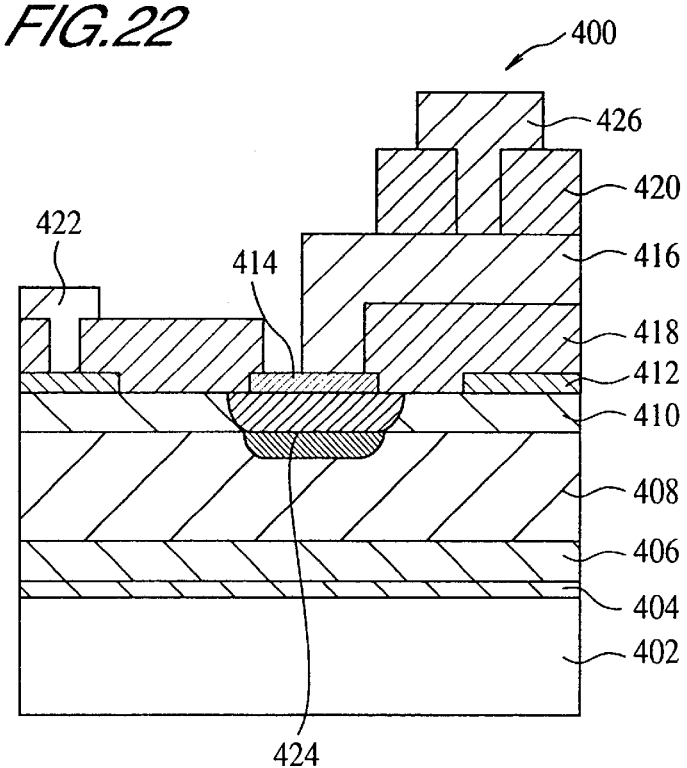
FIG. 22 is a cross-sectional view taken along the line A–A' in FIG. 21.

FIG. 21 is a schematic plan view illustrating a typical structure of the LED array 400 of the fourth embodiment of the present invention, while FIG. 22 is a cross-sectional view taken along the line A–A' in FIG. 21. In the course of the description of the structure of the LED in the present embodiment, those structural parts which are the same as those illustrated in FIG. 18 will be denoted the same numerals.

As shown in FIGS. 21 and 22, LED array 400 comprises semi-insulating GaAs substrate 402, a semi-insulating GaAs buffer layer 404, an n-type $Al_z Ga_{1-z}$ As layer 406 (third epitaxial layer) epitaxially formed on the semi-insulating GaAs buffer layer 404, an n-type $Al_y Ga_{1-y}$ As layer 408 (first epitaxial layer), an n-type $Al_x Ga_{1-x}$ As layer 410 (second epitaxial layer), an n-type GaAs layer 412 provided for the sake of forming an ohmic contact with the electrode, and an island-shaped Zn-diffused GaAs layer area 414. This Zn-diffused GaAs layer area 414 is an island-shaped area electrically isolated from the n-type GaAs layer 412 by removing the p-n junction area formed within the GaAs layer. A p-side electrode contact 416 which is, for example, Al-type electrode is formed on either all or part of this GaAs layer area 414.

The LED array 400 further comprises an inter-layer insulating film 418, an inter-layer insulating film 420, the n-side electrode 422, comprising for instance an Au-type electrode and a diffused area 424. A common p-side pattern 426 is connected to the p-side electrode 416. Electrode pads 428, 430 are connected to the common p-side pattern 426 and the n-side electrode 422, respectively.

Figure 23:
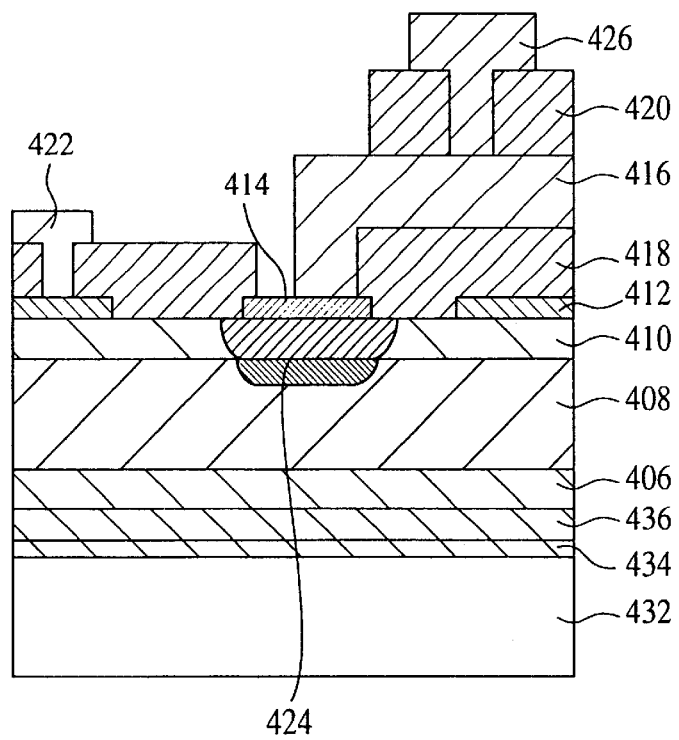
FIG. 23 is a cross-sectional view showing an LED of the modification of the fourth embodiment of the present invention.

In the present embodiment, it is possible to employ, as the substrate, a non-doped GaAs substrate or a high-resistance Si substrate instead of the semi-insulating GaAs substrate 402. As the latter it is possible to employ, for instance, a high-resistance Si substrate with a specific resistance in the region of 1500 Ωcm. If a high-resistance Si substrate 432 is used, it is possible to ensure insulation between the Si substrate 432 and the n-type epitaxial layers (third epitaxial layer 406/first epitaxial layer 408/second epitaxial layer 410/fourth epitaxial layer 412) by providing a laminated structure comprising a non-doped GaAs layer 434 and an $Al_t Ga_{1-t}$ As layer 436 (t>0, t>x) as illustrated in FIG. 23.

The n-type epitaxial layers comprise a four-layer laminated structure (GaAs/$Al_y Ga_{1-y}$ As/$Al_x Ga_{1-x}$ As/$Al_z Ga_{1-z}$ As) as in the modified example of the third embodiment, and x<y, z.

As has been explained in relation to the modified example of the third embodiment, the present embodiment has a p-n junction which is formed by diffusing Zn selectively on to the n-type epitaxial laminated structure. The diffusion front of the diffusion area, i.e. the p-n junction surface which is roughly parallel with the principal surface of the substrate 402, is within the first epitaxial layer 408, which is sandwiched between the second epitaxial layer 410 and third epitaxial layer 406, and has an energy band gap smaller than either of these.

In the present embodiment, a discrete electrode (individual electrode) is provided in the p-type area, a common electrode in the n-type area. The n-type area, which contains LEDs to the number k, is divided into a plurality of blocks by means of an isolating area 440, for instance, which reaches to the semi-insulating substrate as illustrated in FIG. 21. Discrete conductive pattern 416 (individual conductive pattern) of the same order within each n-type block is joined by the common conductive pattern 426. The discrete conductive patterns 416 and the common conductive patterns 426 constitute matrix conductive patterns (matrix wiring). The p-side electrode is not necessarily made of an Al-type material, and may be formed of an Au-type material.

It is possible to omit the n-side electrode 422 and the wiring (conductive pattern) which stretches from the n-side electrode pad 430 to the n-side electrode 422, and to allow the n-side electrode pad 430 to also serve as the n-side electrode by forming an ohmic contact between the n-side electrode pad 430 and the n-side GaAs layer 412.

There follows a description of the operation of the LED array 400.

Forward-direction voltage is impressed between the common electrode within the n-type block in which LED to be lit is contained and the common conductive pattern connected to the LED to be lit. As in the third embodiment, the injected carrier is contained in the direction perpendicular to the principal surface of the substrate by the energy barrier which exists at the boundaries of the second epitaxial layer 410 and the first epitaxial layer 408, and of the third epitaxial layer 406 and the first epitaxial layer 408. Thus, the probability of carriers recombination increases, as does the l ig ht-emitting efficiency.

As has been explained in relation to all the above embodiments, the light-emitting wavelength of the elements in the present embodiment is determined by the energy band gap of the first epitaxial layer 408, and the current-voltage characteristics are the same as the characteristics of the p-n junction formed within the first epitaxial layer 408.

As has been explained above, the LED array of the fourth embodiment is formed by diffusing Zn selectively on to a laminated epitaxial structure comprising an epitaxial layer with a relatively small energy band gap sandwiched between two epitaxial layers with relatively large energy band gaps in such a manner that the diffusion front is present within the epitaxial layer with the relatively small energy band gap. Moreover, the structure is such that the n-type laminated epitaxial structure is formed on a semi-insulating GaAs substrate 402 so that it can be separated into a suitable number of unit blocks containing a p-n junction and electrically insulated from one another. This means that matrix drive is feasible, and a high light-emitting efficiency can be obtained.

Inasmuch as junctions are formed by selective diffusion, there is no need to separate elements by means of mesa etching and similar processes, and it is therefore easy to obtain LED arrays with an ultra-high density of 1200 dpi. The element-separating structure which divides the n-type laminated epitaxial structures into a plurality of blocks electrically insulated from one another is a very simple one for achieving this end, and is also very simple to produce. Even where LEDs are integrated to an ultra-high density of 1200 dpi, the present embodiment allows electrode wiring to assume a matrix structure, so that the electrode pad density, ie the pitch of the electrode pads, can be reduced. This makes it possible to reduce the density of connection with the drive IC which drives the LED array, so that connection is simple. These factors serve to lower the cost of the LED array chips.

Furthermore, as in the case of the modification of the third embodiment, there is no need to provide a GaAs layer as contact layer if an $Al_y Ga_{1-y}$ As layer (second epitaxial layer) is used with an Al composition which allows the p-side electrode contact to be formed with low contact resistance. Moreover, instead of three layers-structure made of the second epitaxial layer 406 and the first epitaxial layer 408 and the third epitaxial layer 410, two layers-structure made of the second epitaxial layer and the first epitaxial layer may be employed.

It is also possible to provide a non-doped laminated structure comprising $Al_q Ga_{1-q} As/Al_r Ga_{1-r} As/\ldots$ beneath the first epitaxial layer or third epitaxial layer.

(Fifth Embodiment)

Figure 24:
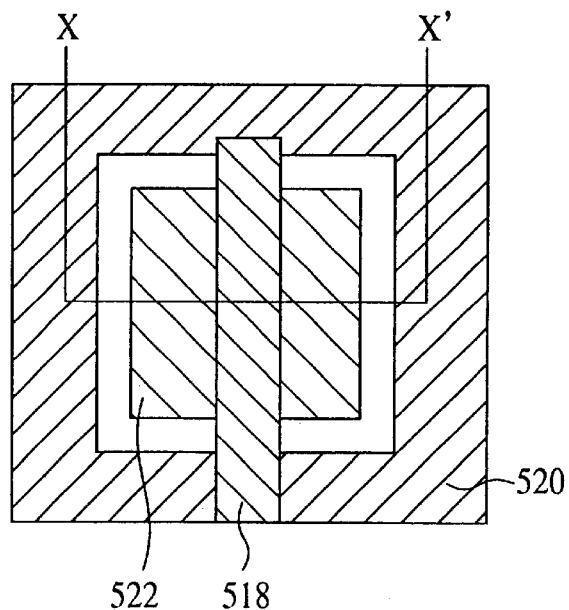
FIG. 24 is a schematic plan view showing an LED of the fifth embodiment of the present invention.
Figure 25:
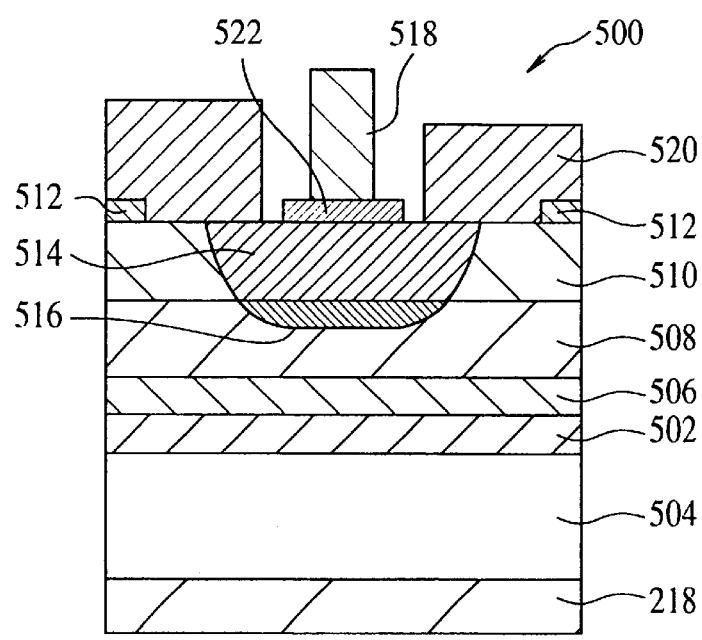
FIG. 25 is a cross-sectional view taken along the line X–X' in FIG. 24.

FIG. 24 is a schematic plan view showing an LED 500 of the fifth embodiment of the present invention. FIG. 25 is a cross-sectional view taken along the line X–X' in FIG. 24.

As shown in FIG. 25, LED 500 comprises an n-type GaAs buffer layer 502 formed on an n-type GaAs substrate 504 and a laminated structure formed by the epitaxial growth of an n-type $Al_z Ga_{1-z}$ As layer (third epitaxial layer) 506, an n-type $Al_x Ga_{1-x}$ As layer (first epitaxial layer) 508, an n-type $Al_y Ga_{1-y}$ As layer (second epitaxial layer) 510 and an n-type GaAs layer (fourth epitaxial layer) 512. Here, $y, z > x \geq 0$. The laminated epitaxial structure has a diffusion area 514 formed by selective diffusion of Zn, and the diffusion front 516 of the diffusion area 514 is within the first epitaxial layer 508.

As seen from FIGS. 24 and 25, the p-side electrode 518 is an electrode structure passing through an orifice in the inter-layer insulating film 520. The p-side electrode 518 has ohmic contact with part of the GaAs layer area 522 of the Zn-diffused area formed in the shape of islands in the interlayer insulating film orifice. The Zn-diffused GaAs layer area 522, which is provided for forming ohmic contact with the p-side electrode 518, is separated from the surrounding n-type GaAs layer 512, and there is no p-n junction within the GaAs layer 512.

An example will be described where the diffusion depth is extremely small. For instance, the fourth epitaxial layer 512 is 0.05 $\mu$m in thickness, the second epitaxial layer 510 is 0.2 $\mu$m in thickness, the first epitaxial layer 508 is 0.5 $\mu$m in thickness, the third epitaxial layer 506 is 0.2 $\mu$m in thickness, and the GaAs buffer layer 502 is 0.1 $\mu$m in thickness. The diffusion front is of such a depth as will come within the first epitaxial layer, e.g. Xj=0.35. In this case, it is possible to structure all the epitaxial layers in a thickness of about 1 $\mu$m, thus reducing the cost of the substrate.

Assuming the concentration of the diffused Zn to be the maximum possible concentration, i.e. approximately $1 \times 10^{20}$ cm$^{-3}$, the specific resistance $\rho$ of the diffusion area may be predicted, on the basis of $\rho = 1/q \, N \, \mu p$ (where q is the electric charge of the electrons, $q = 1.6 \times 10^{-19}$ C, N is the p-type carrier concentration or Zn diffusion concentration, and $\mu p$ is the mobility of the carrier, $\mu p = 25$ cm$^2$/VS), to be $\rho = 2.5 \times 10^{-3}$ $\Omega$cm. At such a time, the sheet resistance of the diffusion area $\rho s = \rho/Xj$ is approximately 70 $\Omega$. At a current of 3 mA, the voltage fall is about 210 mV. If the diffusion depth is 1 $\mu$m, the voltage fall at a current of 3 mA is approximately 70 mV, and the effect is small. The effect of the voltage fall is greater at, for instance, 0.35 $\mu$m. For this reason, the reduction in light-emitting efficiency in areas at a distance from the electrode is greater where the diffusion depth is 0.35 $\mu$m than where it is 0.1 $\mu$m. According to the general conditions of diffusion, the effect of voltage fall is greater than that predicted above because the Zn diffusion level is lower than $10^{20}$ cm$^{-1}$.

Structuring the electrode in such a manner that it extends through the diffusion orifice as in the present embodiment allows the distance from the juncture to the electrode to be reduced, and the distance between junction and electrode within the diffusion orifice to be rendered more or less uniform, with the result that a uniformly high distribution of emitted light intensity can be realised.

As has been described above, the fifth embodiment is structured in such a manner that an n-type GaAs buffer layer 502 is formed on an n-type GaAs substrate 504 and a laminated structure formed by the epitaxial growth of an n-type $Al_z Ga_{1-z}$ As layer (third epitaxial layer) 506, an n-type $Al_x Ga_{1-x}$ As layer (first epitaxial layer) 508, an n-type $Al_y Ga_{1-y}$ As layer (second epitaxial layer) 510 and an n-type GaAs layer (fourth epitaxial layer) 512 (y, z > x $\geq$ 0). This laminated epitaxial structure has a diffusion area 514 formed by selective diffusion of Zn, and the diffusion front 516 of the diffusion area 514 is within the first epitaxial layer 508. The p-side electrode is formed so as to extend through the diffusion orifice, thus allowing all the epitaxial layers of the light-emitting element to be rendered thinner and the diffusion depth smaller with the aim of realising a uniform distribution of emitted light intensity within the light-emitting surface. This makes it possible to manufacture the LED or LED array chips having a high light-emitting efficiency at a low cost.

Alternatively, a transparent conductive film having ohmic contact with the GaAs area within the diffusion orifice may be provided to form an electrode contact.

Furthermore, as in the case of all the above embodiments, modifications in the structure of the substrate and epitaxial layers are clearly feasible.

(Sixth Embodiment)

An LED 600 according to the sixth embodiment of the present invention will be described with reference to FIG. 26. FIG. 26 is a schematic cross-sectional view of the LED 600.

As shown in FIG. 26, the LED 600 has a similar structure to the LED 350 shown in FIG. 20. Therefore, only points which differ from the LED 350 will be described, and points which are the same as the LED 350 are given same reference numerals as the LED 350 and the description thereof is omitted.

As shown in FIG. 26, the LED 600 comprises a laminated structure 602 provided between the n-type GaAs buffer layer and the third epitaxial layer 302. In the laminated structure 602, $Al_q Ga_{1-q}$ As layers and $Al_r Ga_{1-r}$ As layers, are alternately laminated.

According to the LED 600 of the present embodiment, light generated in the first epitaxial layer 106 and emitted from the bottom surface of the first epitaxial layer 106 toward the substrate 102 is upwardly reflected by the laminated structure 602. Thus, the light emitted from the upper surface of the second epitaxial layer 108 increases.

Alternatively, the substrate may be semi-insulating, non-doped or p-type substrate.

Employing a non-doped or p-type laminated substrate, an LED array which can be capable of the matrix drive as the LED array shown in FIG. 21. In this case, the n-type electrode and p-type electrode are provided on the same side of the substrate.

In all the above embodiments the examples have employed an n-type $Al_x Ga_{1-x}$ As layer as the light-emitting layer. However, it is obvious that provided the structure of the light-emitting element array is such that impurities of a second conduction type are diffused selectively to at least two epitaxial layers of a first conduction type with differing energy band gaps from a semiconductor layer with a relatively large energy band gap, and at least the diffusion front in the direction of the diffusion depth is present within a semiconductor epitaxial layer with a relatively small energy band gap, the principle may be applied whatever semiconductor materials are used.

Moreover, in all the above embodiments the description has related to examples where the thickness of the epitaxial layers d1=1 $\mu$m, d2=0.3 $\mu$m, but these dimensions are of course only an example.

Furthermore, provided the LED arrays to which all the above embodiments pertain accord with the above structure, the configuration is irrelevant, and there is no restriction on the manufacturing process, type of substrate, number of arrays, location or other conditions.

In all the above embodiments the structure and method of manufacture of the LED arrays has been shown, and it is obvious that the structure and method of manufacture whereby impurities of a second conduction type are diffused selectively to at least two epitaxial layers of a first conduction type with differing energy band gaps from a semiconductor layer with a relatively large energy band gap, and at least the diffusion front in the direction of the diffusion depth is present within a semiconductor epitaxial layer with a relatively small energy band gap may be applied even to individual light-emitting elements.

The light-emitting element array and light-emitting element to which the present invention applies have a laminated structure comprising a first semiconductor epitaxial layer, within which is present the diffusion front of the selective diffusion area, and a second semiconductor epitaxial layer which has contact with the electrode, and are structured in such a manner that the energy band gap Eg1 of the first semiconductor epitaxial layer is at least smaller than the energy band gap Eg2 of the second semiconductor epitaxial layer, while the thickness of the semiconductor epitaxial layers is $(Lp-W1-da)/2 \geq X1 = [d2+\alpha \times (Xj-d2)] \times b$. In this manner it is possible to realise a high-density light-emitting element array and a light-emitting element with a high light-emitting efficiency which are capable of mass production at low cost and with a high yield.

In addition to above structure of the epitaxial layers, the structure of the GaAs layer which is provided as the very top layer of the epitaxial layer structure in order to form ohmic contact with the p-side electrode is such that Zn-diffused island-shaped GaAs layer areas are formed in the area selectively diffused with Zn, and there is no p-n junction within the GaAs layer. This permits the realisation of a light-emitting element array having a high light-emitting efficiency.

What is claimed is:

1. A light-emitting diode comprising:
   a semiconductor substrate;
   a first semiconductor epitaxial layer of a first conduction type formed on or above said semiconductor substrate;
   a second semiconductor epitaxial layer of the first conduction type laminated upon said first semiconductor epitaxial layer and having an energy band gap greater than an energy band gap of said first semiconductor epitaxial layer;
   an impurity diffusion area of a second conduction type having island shape formed within said first and second semiconductor epitaxial layers, said impurity diffusion area being formed by selective diffusion of an impurity of the second conduction type, a diffusion front of said impurity diffusion areas extending from a top surface of said second semiconductor epitaxial layer therethrough into said first semiconductor epitaxial layer; and
   an electrode contact semiconductor layer of the second conduction type provided on a top surface of said impurity diffusion area, said electrode contact semiconductor layer being formed by selective diffusion of the impurity of the second conduction type and having no contact with said second semiconductor epitaxial layer outside said impurity diffusion area,
   said second semiconductor epitaxial layer having a recess formed in a top surface thereof including the diffusion front that extends to the top surface, said recess surrounding the electrode contact semiconductor layer.

2. The light-emitting diode according to claim 1, wherein said impurity is Zn.

3. The light-emitting diode according to claim 1, wherein said first and second semiconductor epitaxial layers are made of a compound semiconductor.

4. The light-emitting diode according to claim 1, wherein said first and second semiconductor epitaxial layers include n-type $Al_xGa_{1-x}As$ (x>0).

5. The light-emitting diode according to claim 1, further comprising:
   a semiconductor substrate made of semi-insulating GaAs, p-type GaAs, non-doped GaAs or a high resistance Si; and
   a semi-insulating GaAs buffer layer provided between said first semiconductor epitaxial layer and said semiconductor substrate.

6. A light-emitting diode array, comprising:
   a semiconductor substrate;
   a first semiconductor epitaxial layer of a first conduction type formed on or above said semiconductor substrate;
   a second semiconductor epitaxial layer of the first conduction type laminated upon said first semiconductor epitaxial layer and having an energy band gap greater than an energy band gap of said first semiconductor epitaxial layer;
   impurity diffusion areas of a second conduction type having island shape formed within said first and second semiconductor epitaxial layers, said impurity diffusion areas being formed by selective diffusion of an impurity of the second conduction type, a diffusion front of each of said impurity diffusion areas extending from a top surface of said second semiconductor epitaxial layer therethrough into said first semiconductor epitaxial layer;
   electrode contact semiconductor layers of the second conduction type respectively provided on top surfaces of said impurity diffusion areas, each of said electrode contact semiconductor layers being formed by selective diffusion of the impurity of the second conduction type and having no contact with said second semiconductor epitaxial layer outside said impurity diffusion areas; and
   interconnection layers respectively connected to said electrode contact semiconductor layers, each of said interconnection layers comprising a metal component as a main component;
   wherein said second semiconductor epitaxial layer of each light-emitting diode of the light-emitting diode array has formed therein a recess having a certain depth from the top surface of said second semiconductor epitaxial layer, each recess being located in a top surface region which includes a part of a diffusion front on a side of the top surface and which surrounds an electrode contact semiconductor layer.

7. The light-emitting diode array according to claim 6, wherein said interconnection layers comprise aluminum as the main component.

8. The light-emitting diode array according to claim 6, wherein a third semiconductor epitaxial layer is located between said semiconductor substrate and said first semiconductor epitaxial layer, said third semiconductor epitaxial layer having an energy band gap greater than the energy band gap of said first semiconductor epitaxial layer.

9. The light-emitting diode array according to claim 8, wherein said third semiconductor epitaxial layer includes a laminated structure in which $Al_qGa_{1-q}As$ layers and $Al_rGa_{1-r}As$ layers (q, r≧0) are alternately laminated.

10. The light-emitting diode array according to claim 6, wherein the impurity is Zn.

11. The light-emitting diode array according to claim 6, wherein said impurity diffusion areas and said electrode contact semiconductor layers have diffused thereinto impurities of Zn, respectively.

12. The light-emitting diode array according to claim 6, wherein said first and second semiconductor epitaxial layers are made of a compound semiconductor.

13. The light-emitting diode array according to claim 6, wherein said first and second semiconductor epitaxial layers including n-type $Al_xGa_{1-x}As$ (x>0).

14. The light-emitting diode array according to claim 6, wherein each light-emitting diode of the light-emitting diode array comprises:

a semiconductor substrate made of semi-insulating GaAs, p-type GaAs, non-doped GaAs or a high resistance Si; and a semi-insulating GaAs buffer layer provided between said first semiconductor epitaxial layer and said semiconductor substrate, the light-emitting diodes being connected by matrix conductive patterns.

* * * * *